United States Patent
Van Dal et al.

(10) Patent No.: US 11,430,512 B2
(45) Date of Patent: Aug. 30, 2022

(54) SEMICONDUCTING METAL OXIDE MEMORY DEVICE USING HYDROGEN-MEDIATED THRESHOLD VOLTAGE MODULATION AND METHODS FOR FORMING THE SAME

(71) Applicant: Taiwan Semiconductor Manufacturing Company Limited, Hsinchu (TW)

(72) Inventors: Marcus Johannes Henricus Van Dal, Linden (BE); Gerben Doornbos, Kessel-Lo (BE); Georgios Vellianitis, Haverlee (BE); Blandine Duriez, Brussels (BE); Mauricio Manfrini, Zhubei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 17/229,748

(22) Filed: Apr. 13, 2021

(65) Prior Publication Data
US 2021/0407590 A1     Dec. 30, 2021

Related U.S. Application Data

(60) Provisional application No. 63/045,353, filed on Jun. 29, 2020.

(51) Int. Cl.
*G11C 11/00* (2006.01)
*G11C 13/00* (2006.01)
(Continued)

(52) U.S. Cl.
CPC ...... *G11C 13/0007* (2013.01); *G11C 13/0069* (2013.01); *H01L 27/2454* (2013.01);
(Continued)

(58) Field of Classification Search
CPC ............ G11C 13/0007; G11C 13/0069; H01L 27/2454; H01L 27/2463; H01L 45/1206; H01L 45/1253; H01L 45/146; H01L 45/16
(Continued)

(56) References Cited

U.S. PATENT DOCUMENTS 6,897,508 B2 * 5/2005 Sneh ................. H01L 27/10861
257/E21.651
7,829,473 B2 * 11/2010 Yoshizumi ............ H01L 27/101
438/758
(Continued)

FOREIGN PATENT DOCUMENTS

| TW | 201613150 A | 4/2016 | |
|---|---|---|---|
| WO | WO-9932684 A1 * | 7/1999 | ............ C23C 16/04 |
| WO | WO-0049660 A1 * | 8/2000 | ........ H01L 27/11502 |

OTHER PUBLICATIONS

Taiwan Patent and Trademark Office, Application No. 110121574 Office Action dated Feb. 10, 2022, 2 pages.

*Primary Examiner* — Viet Q Nguyen
(74) *Attorney, Agent, or Firm* — The Marbury Law Group, PLLC

(57) ABSTRACT

A memory device is provided, which may include a first electrode, a memory layer stack including at least one semiconducting metal oxide layer and at least one hydrogen-containing metal layer, and a second electrode. A semiconductor device is provided, which may include a semiconducting metal oxide layer containing a source region, a drain region, and a channel region, a hydrogen-containing metal layer located on a surface of the channel region, and a gate electrode located on the hydrogen-containing metal layer. Each hydrogen-containing metal layer may include at least one metal selected from platinum, iridium, osmium, and ruthenium at an atomic percentage that is at least 90%, and
(Continued)

may include hydrogen atoms at an atomic percentage in a range from 0.001% to 10%. Hydrogen atoms may be reversibly impregnated into a respective semiconducting metal oxide layer to change resistivity and to encode a memory bit.

20 Claims, 22 Drawing Sheets

(51) Int. Cl.
      *H01L 27/24*       (2006.01)
      *H01L 45/00*       (2006.01)

(52) U.S. Cl.
      CPC ...... *H01L 27/2463* (2013.01); *H01L 45/1206* (2013.01); *H01L 45/1253* (2013.01); *H01L 45/146* (2013.01); *H01L 45/16* (2013.01)

(58) Field of Classification Search
      USPC .......................................................... 365/148
      See application file for complete search history.

(56) References Cited

U.S. PATENT DOCUMENTS

| | | |
|---|---|---|
| 2015/0001676 A1 | 1/2015 | Ananthan et al. |
| 2018/0358475 A1 | 12/2018 | Guo et al. |
| 2020/0075676 A1 | 3/2020 | Salahuddin et al. |
| 2020/0098824 A1 | 3/2020 | Sharma et al. |
| 2020/0345406 A1* | 11/2020 | Kato .................. A61B 18/1233 |
| 2021/0296326 A1* | 9/2021 | Ino .................... H01L 27/11597 |

* cited by examiner

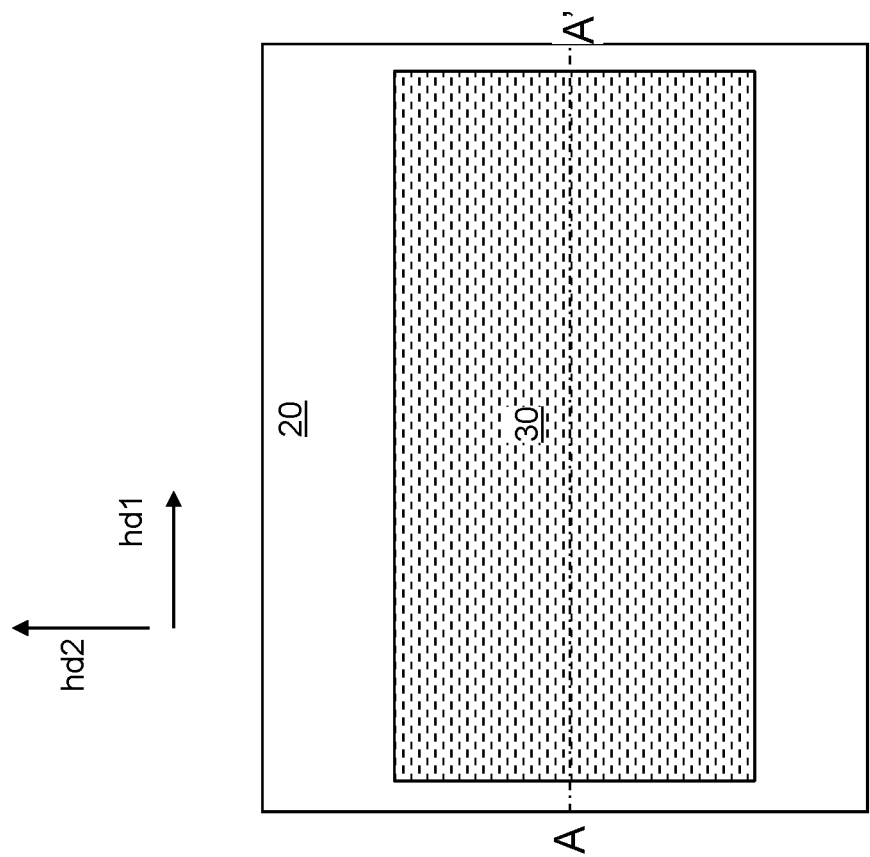
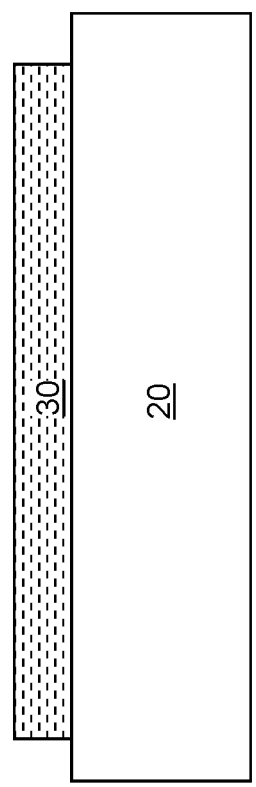
FIG. 12B
FIG. 12A

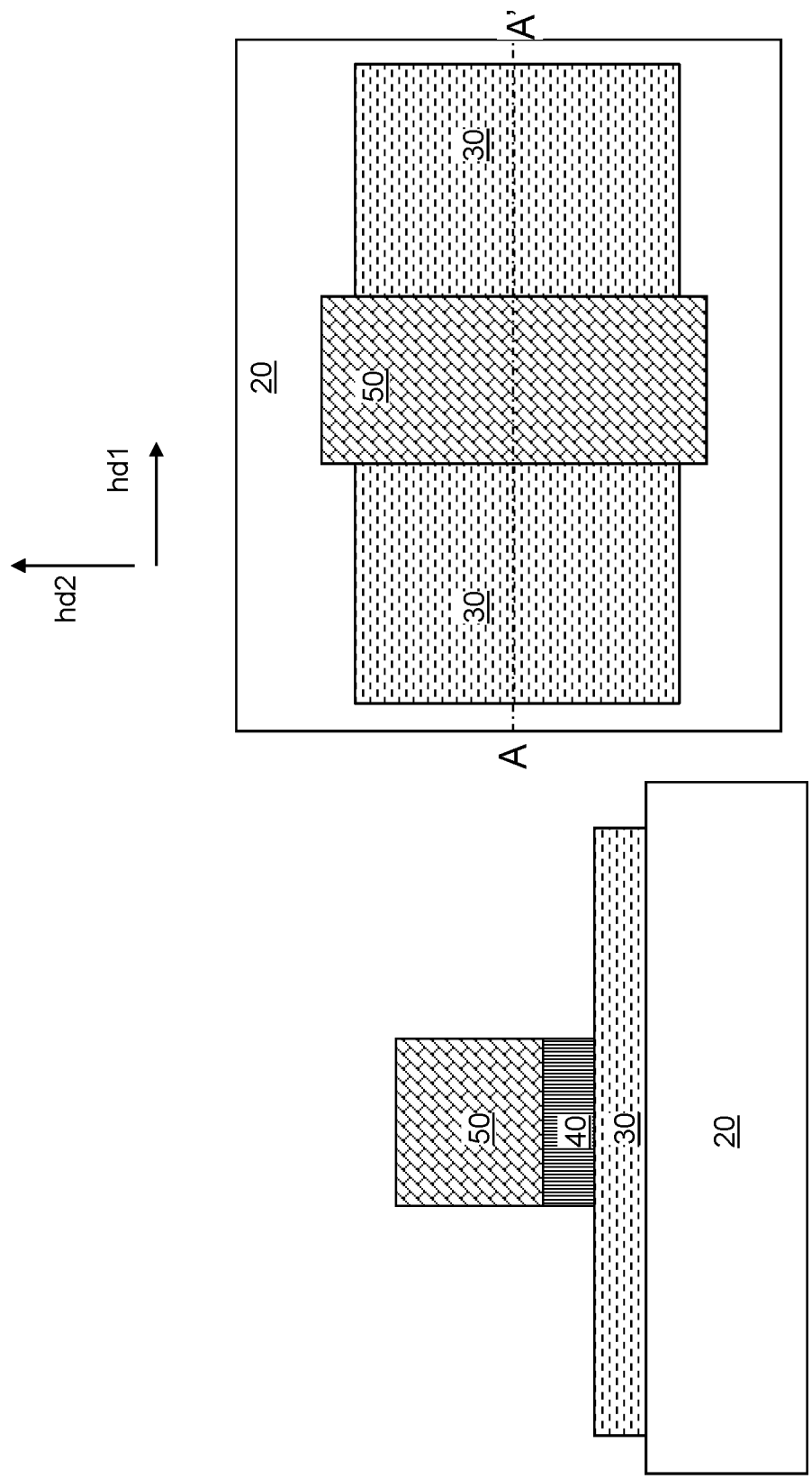

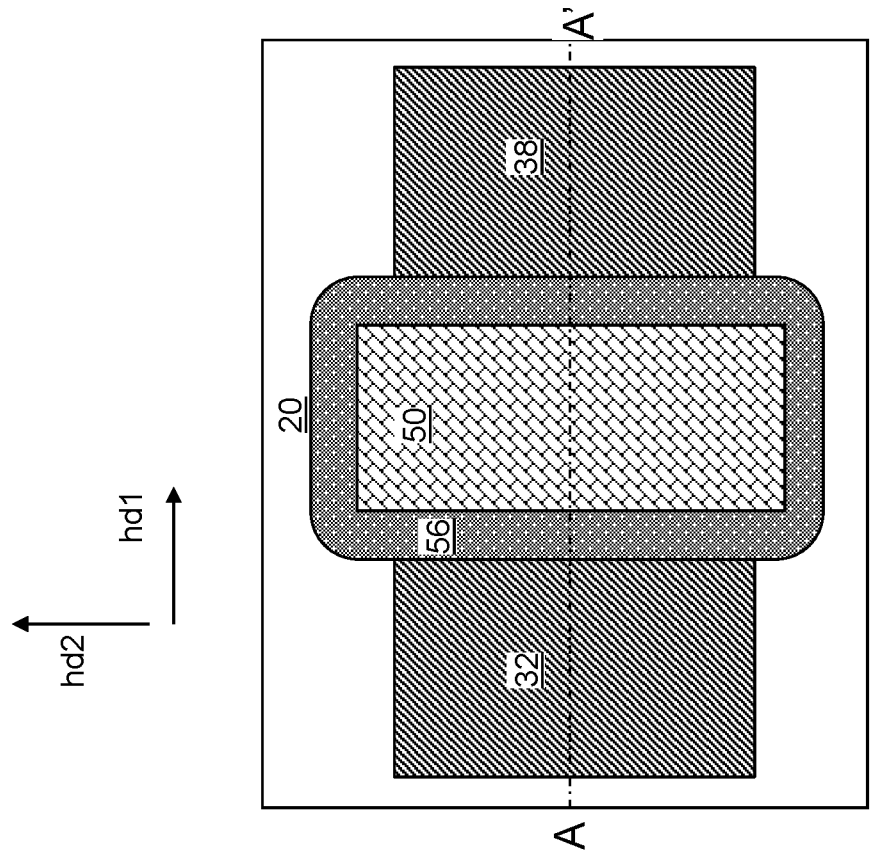
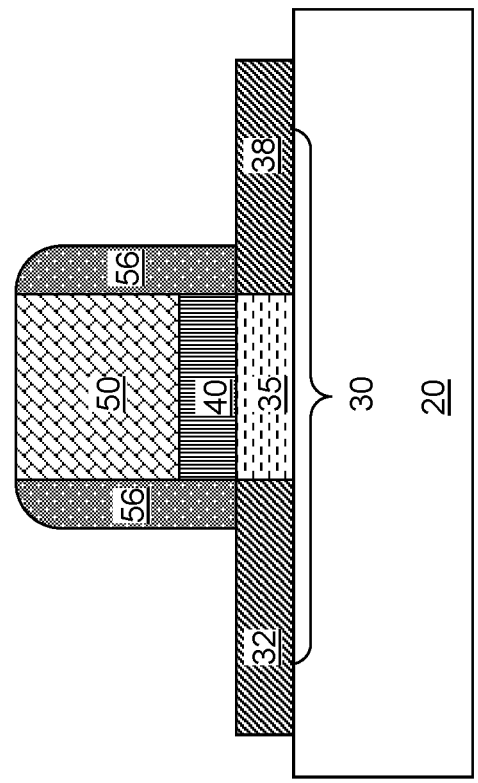
FIG. 14B
FIG. 14A

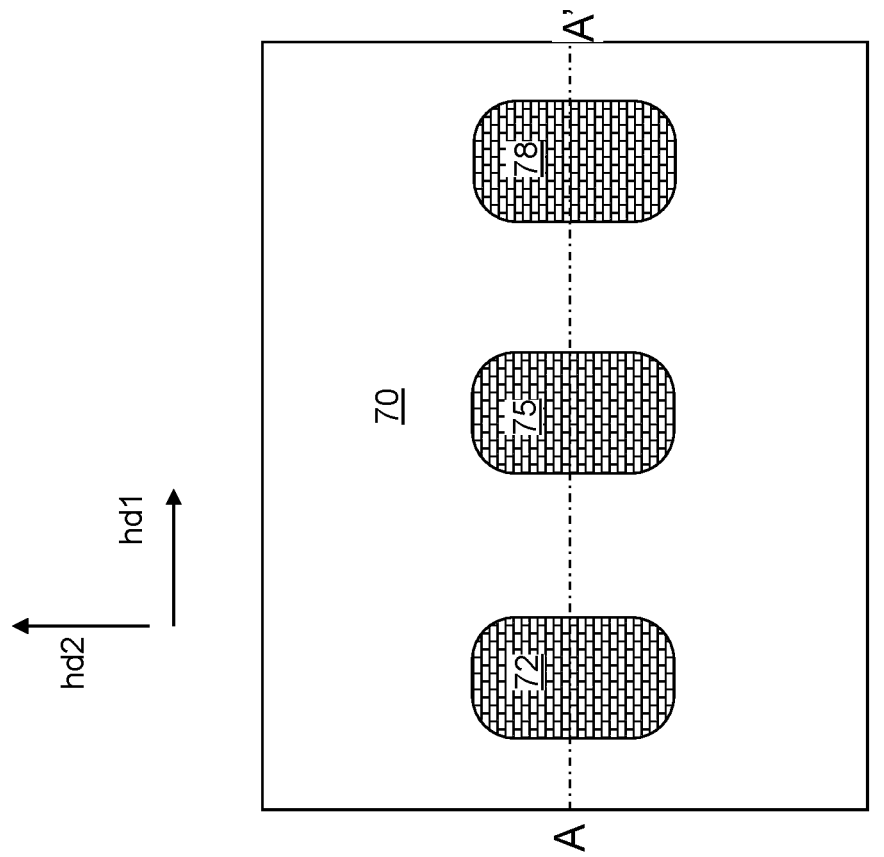
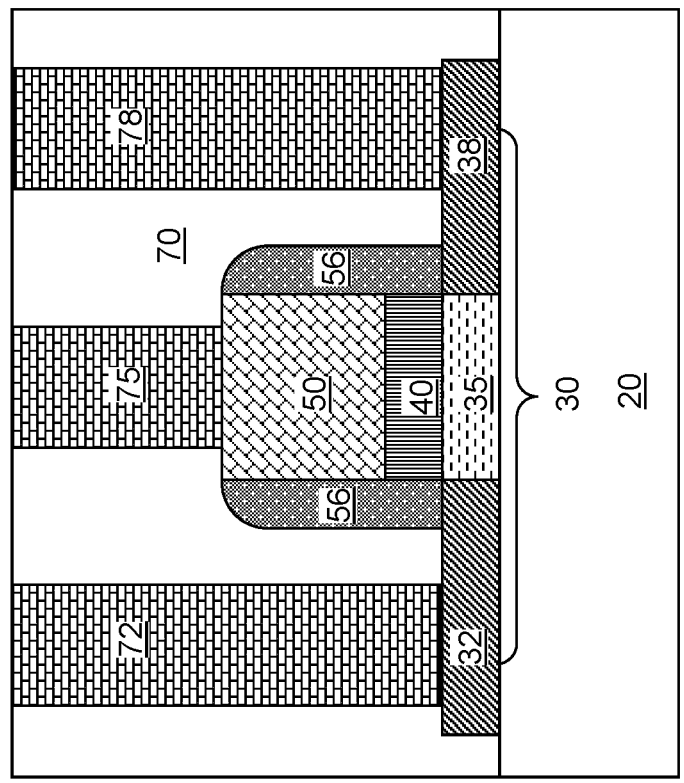
FIG. 15A
FIG. 15B

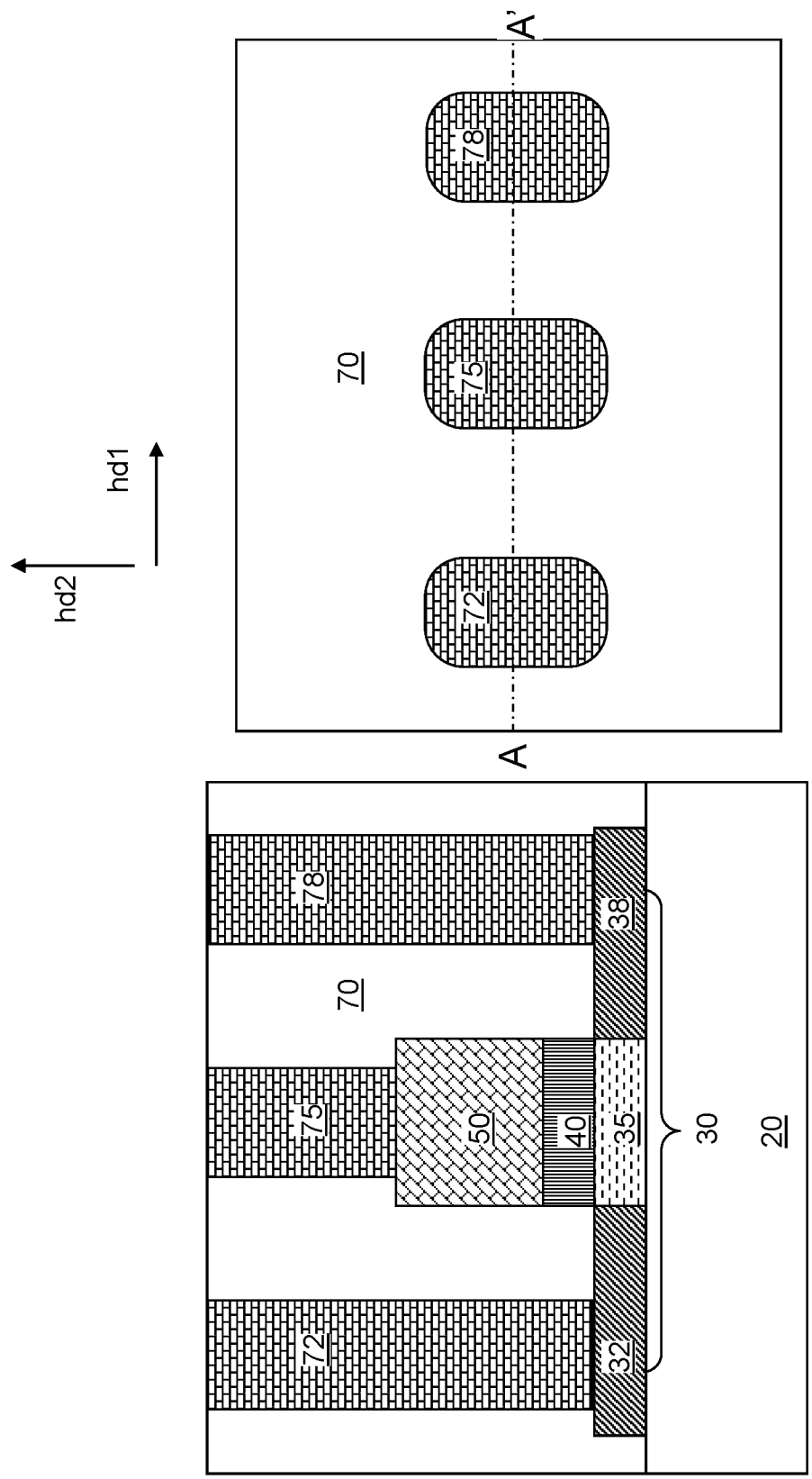

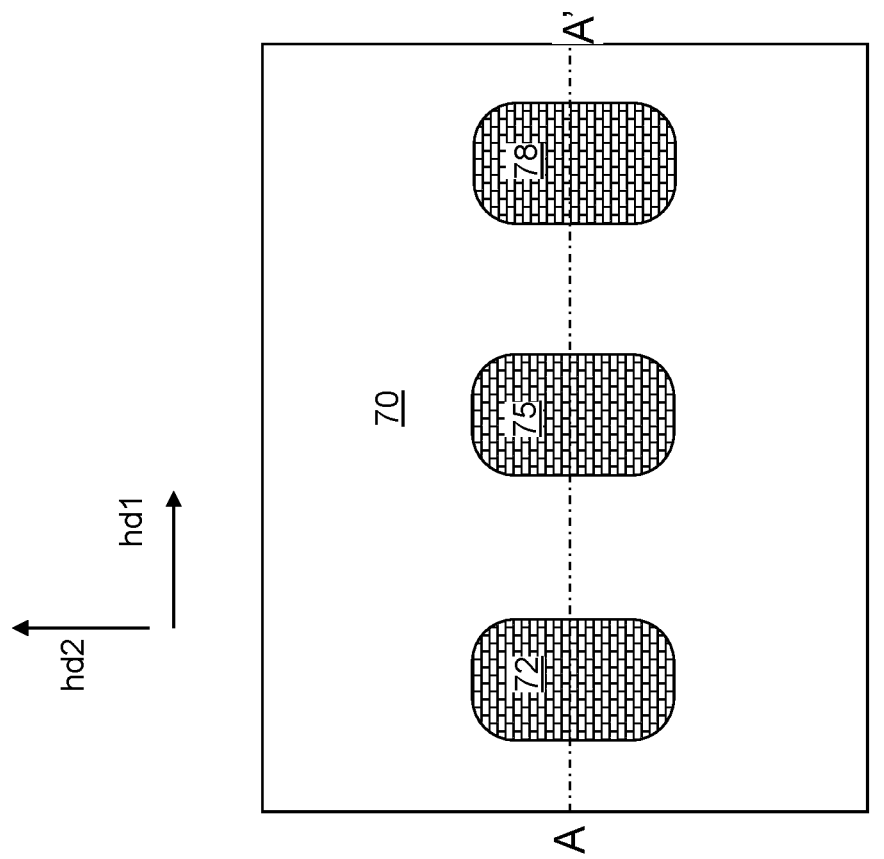
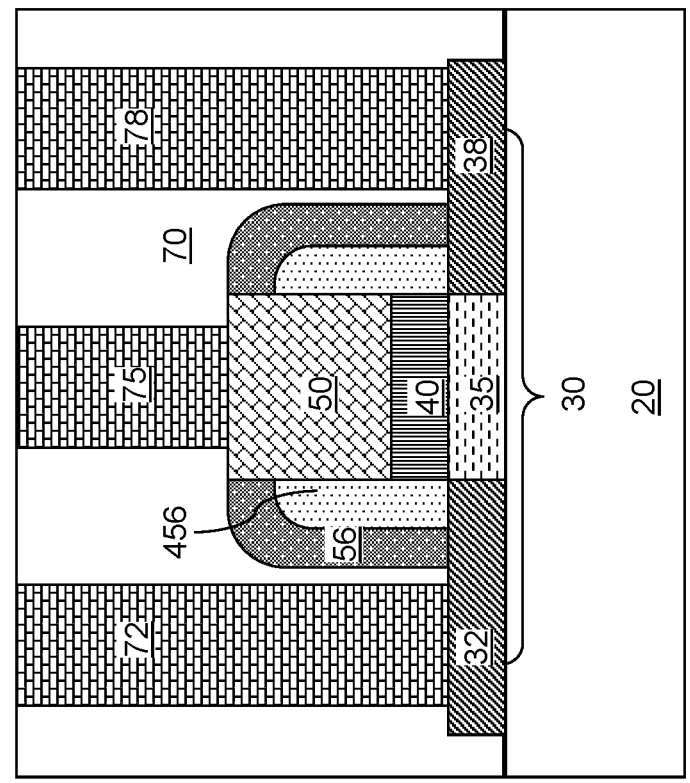
FIG. 17A
FIG. 17B

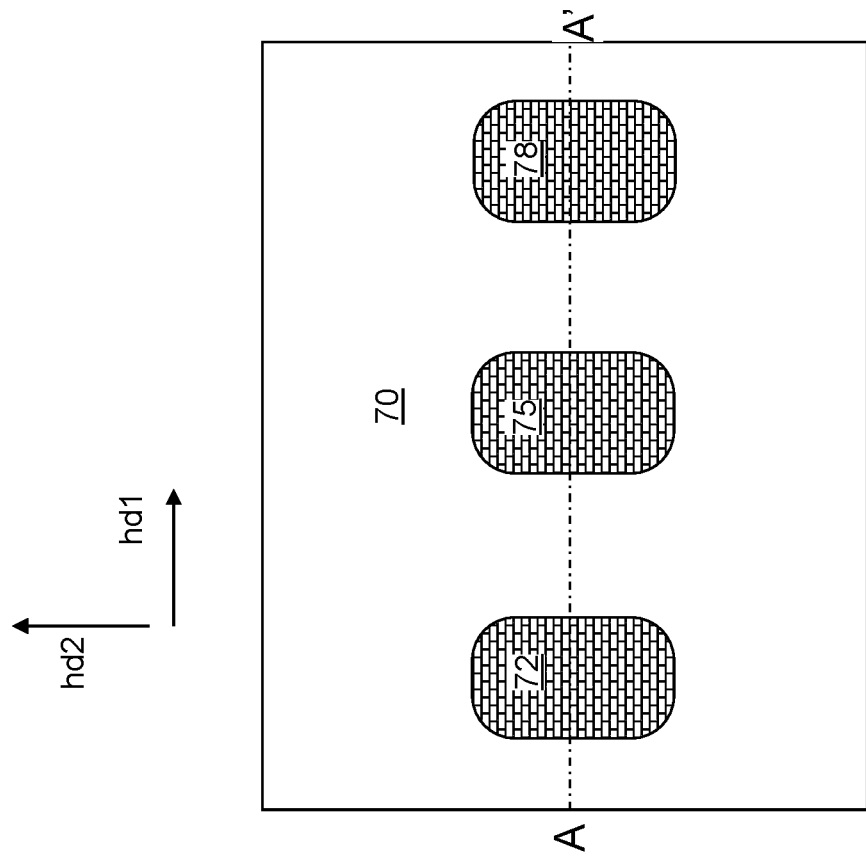
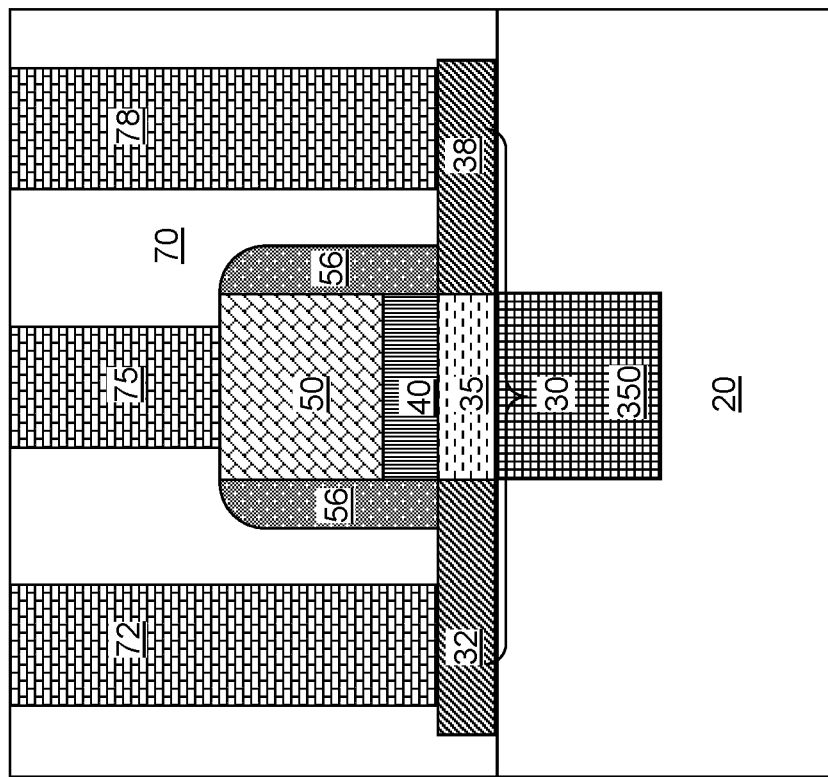
FIG. 18A
FIG. 18B

SEMICONDUCTING METAL OXIDE MEMORY DEVICE USING HYDROGEN-MEDIATED THRESHOLD VOLTAGE MODULATION AND METHODS FOR FORMING THE SAME

RELATED APPLICATIONS

This application claims the benefit of priority from U.S. Provisional Application No. 63/045,385 entitled "Novel IGZO Based Memory Element including a H Reservoir", filed on Jun. 29, 2020, the entire contents of which are hereby incorporated by reference for all purposes.

BACKGROUND

As semiconductor devices scale to smaller dimensions, new types of semiconductor memory cells providing high endurance and requiring low operational power are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12A is a vertical cross-sectional view of a second exemplary structure after formation of a semiconducting metal oxide layer over a dielectric material layer according to a second embodiment of the present disclosure.

FIG. 12B is a top-down view of the second exemplary structure of FIG. 12A. The vertical plane A-A' is the plane of the vertical cross-sectional view of FIG. 12A.

FIG. 13A is a vertical cross-sectional view of the second exemplary structure after formation of a hydrogen-containing metal layer and a gate electrode over the semiconducting metal oxide layer according to the second embodiment of the present disclosure.

FIG. 13B is a top-down view of the second exemplary structure of FIG. 13A. The vertical plane A-A' is the plane of the vertical cross-sectional view of FIG. 13A.

FIG. 14A is a vertical cross-sectional view of the second exemplary structure after formation of a dielectric diffusion barrier spacer, a source region, and a drain region according to the second embodiment of the present disclosure.

FIG. 14B is a top-down view of the second exemplary structure of FIG. 14A. The vertical plane A-A' is the plane of the vertical cross-sectional view of FIG. 14A.

FIG. 15A is a vertical cross-sectional view of the second exemplary structure after formation of a source contact via structure, a drain contact via structure, and a gate contact via structure according to the second embodiment of the present disclosure.

FIG. 15B is a top-down view of the second exemplary structure of FIG. 15A. The vertical plane A-A' is the plane of the vertical cross-sectional view of FIG. 15A.

FIG. 16A is a vertical cross-sectional view of a first alternative configuration of the second exemplary structure according to the second embodiment of the present disclosure.

FIG. 16B is a top-down view of the first alternative configuration of the second exemplary structure of FIG. 16A. The vertical plane A-A' is the plane of the vertical cross-sectional view of FIG. 16A.

FIG. 17A is a vertical cross-sectional view of a second alternative configuration of the second exemplary structure according to the second embodiment of the present disclosure.

FIG. 17B is a top-down view of the second alternative configuration of the second exemplary structure of FIG. 17A. The vertical plane A-A' is the plane of the vertical cross-sectional view of FIG. 17A.

FIG. 18A is a vertical cross-sectional view of a third alternative configuration of the second exemplary structure according to the second embodiment of the present disclosure.

FIG. 18B is a top-down view of the third alternative configuration of the second exemplary structure of FIG. 18A. The vertical plane A-A' is the plane of the vertical cross-sectional view of FIG. 18A.

19A. The vertical plane A-A' is the plane of the vertical cross-sectional view of FIG. 19A.

Figure 20:
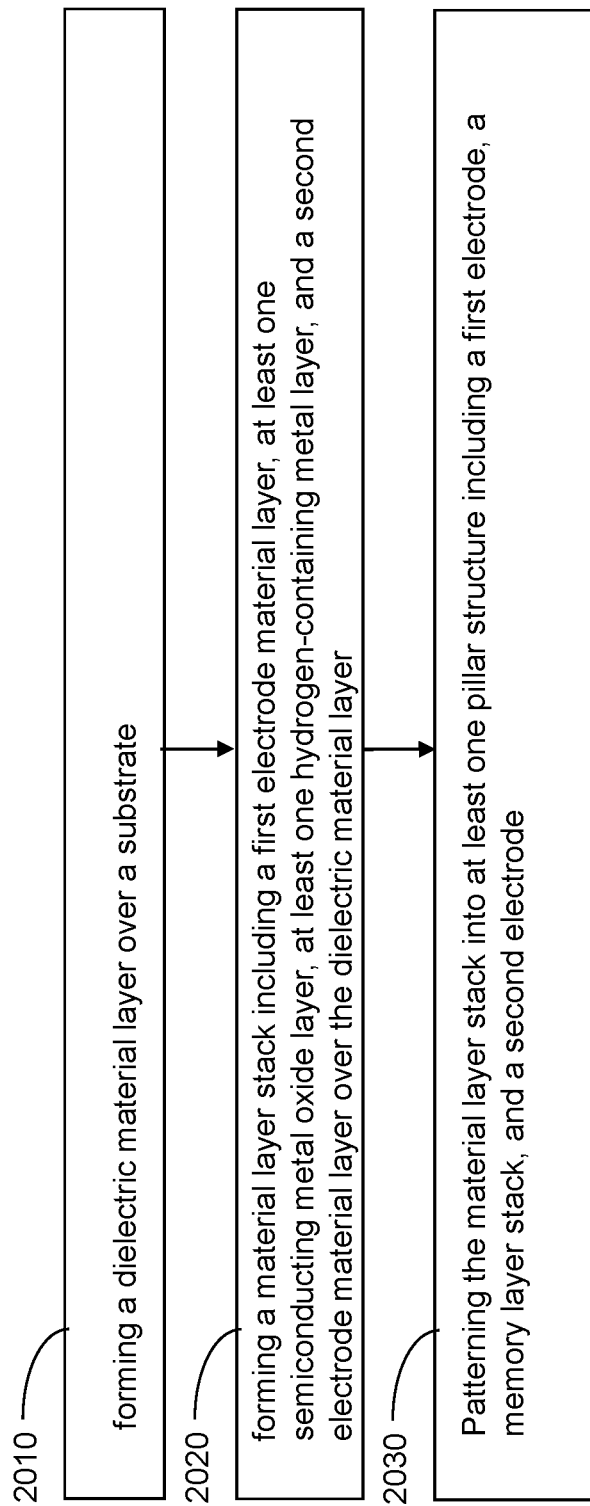

FIG. 20 is a flowchart that illustrates general processing steps of the methods of manufacturing a memory device according to the first embodiment of the present disclosure.

Figure 21:
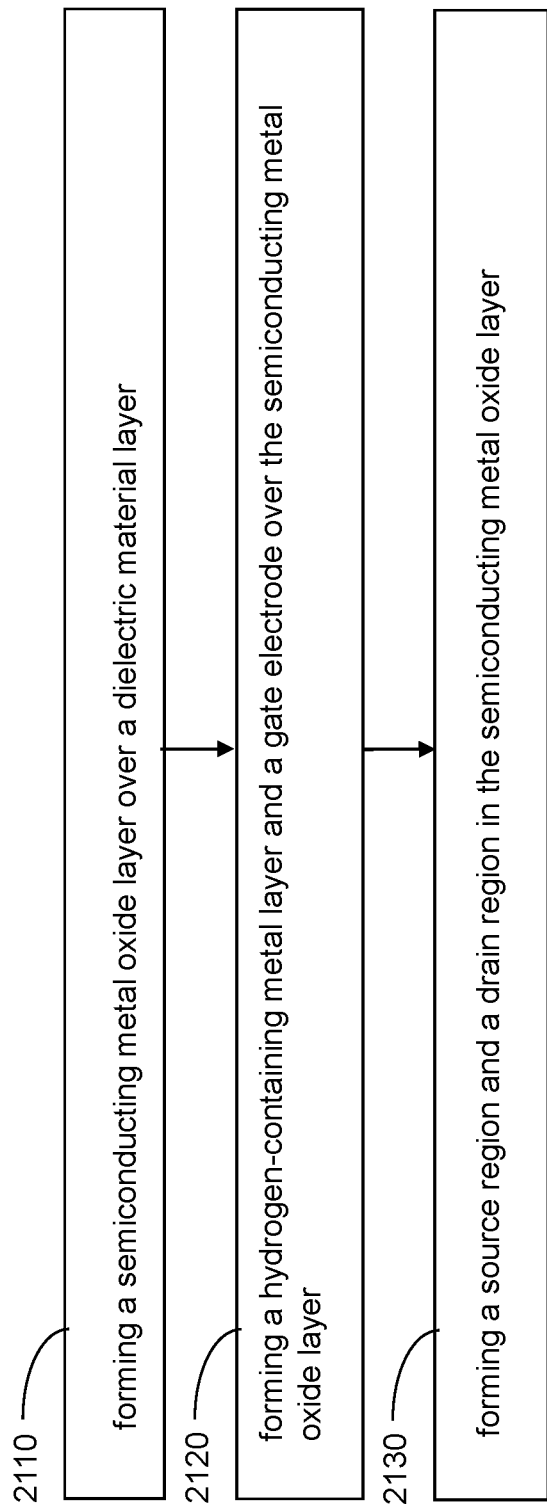

FIG. 21 is a flowchart that illustrates general processing steps of the methods of manufacturing a semiconductor device according to the second embodiment of the present disclosure.

Figure 22:
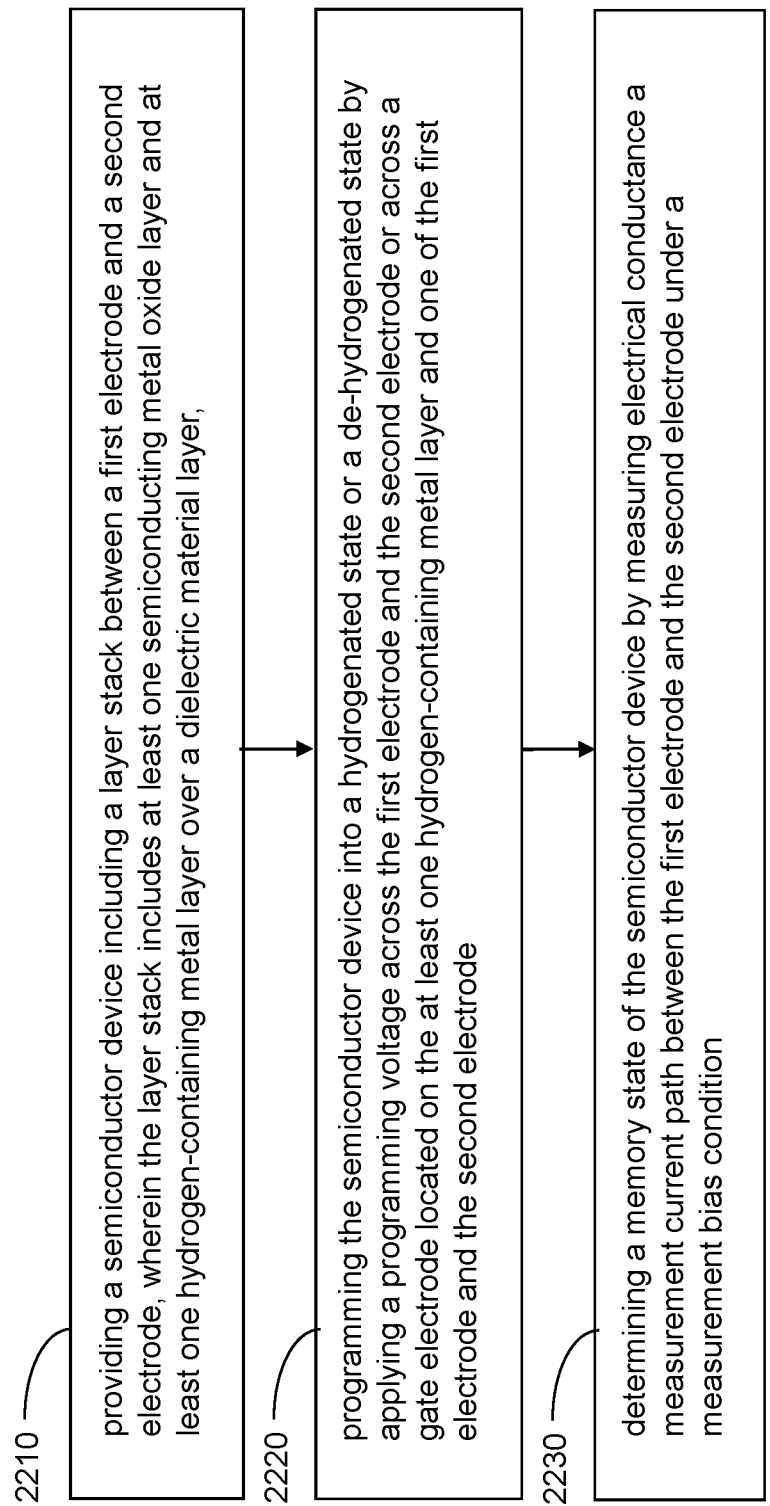

FIG. 22 is a flowchart that illustrates general steps for operating a semiconductor device of the present disclosure.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Hydrides of all the transition metals have been successfully synthesized except those of the four platinum metals and tungsten as described in V. Antonov et al., *The Solubility of Hydrogen in the Platinum Metals under High Pressure*, Platinum Metals Rev., 1984, 28, (4), 158. The "platinum metals" refer to platinum, iridium, osmium and ruthenium. As far as the platinum metals are concerned, there has not been a lack of attempts to synthesize platinum, iridium, osmium and ruthenium hydrides, but the inability to synthesize the platinum metals is due to their low levels of acceptability of hydrogen into their lattices. This inertness or resistance to hydrogen absorption is characterized by the fact that although the chemical potential of hydrogen dissolved in the metal may be very high, solubilities of hydrogen corresponding to equivalent high external pressures of hydrogen gas, are generally very low.

Thus, a hydrogen atom may be present in the platinum metals (i.e., platinum, iridium, osmium and ruthenium) without forming hydrides. Embodiments of the present disclosure recognize that hydrogen may be stored in a relative high atomic concentration in a hydrogen-containing metal layer comprising platinum, iridium, osmium, and/or ruthenium adjacent to a semiconducting metal oxide layer. Hydrogen may be reversibly inserted into, and/or extracted from, a semiconducting metal oxide layer. The hydrogen atoms may be incorporated into interstitial sites of the semiconducting metal oxide material. The hydrogen atoms may act as a shallow donor, thereby lowering the threshold voltage of the semiconducting metal oxide material.

A stack of a hydrogen-containing metal layer and a semiconducting metal oxide layer may be provided between two electrodes, or may be provided in a transistor configuration. An electrical current may flow perpendicular to the interface between the hydrogen-containing metal layer and the semiconducting metal oxide layer. The electrical current may have a variable conductivity that depends on the amount of hydrogen incorporated into the semiconducting metal oxide layer. Alternatively, the electrical current may flow along an in-plane direction within the semiconducting metal oxide layer with different threshold voltages determined by the amount of hydrogen incorporated into the semiconducting metal oxide layer upon application of a gate voltage to the hydrogen-containing metal layer. The various aspects of the present disclosure are now described in detail with reference to accompanying drawings.

Figure 1:
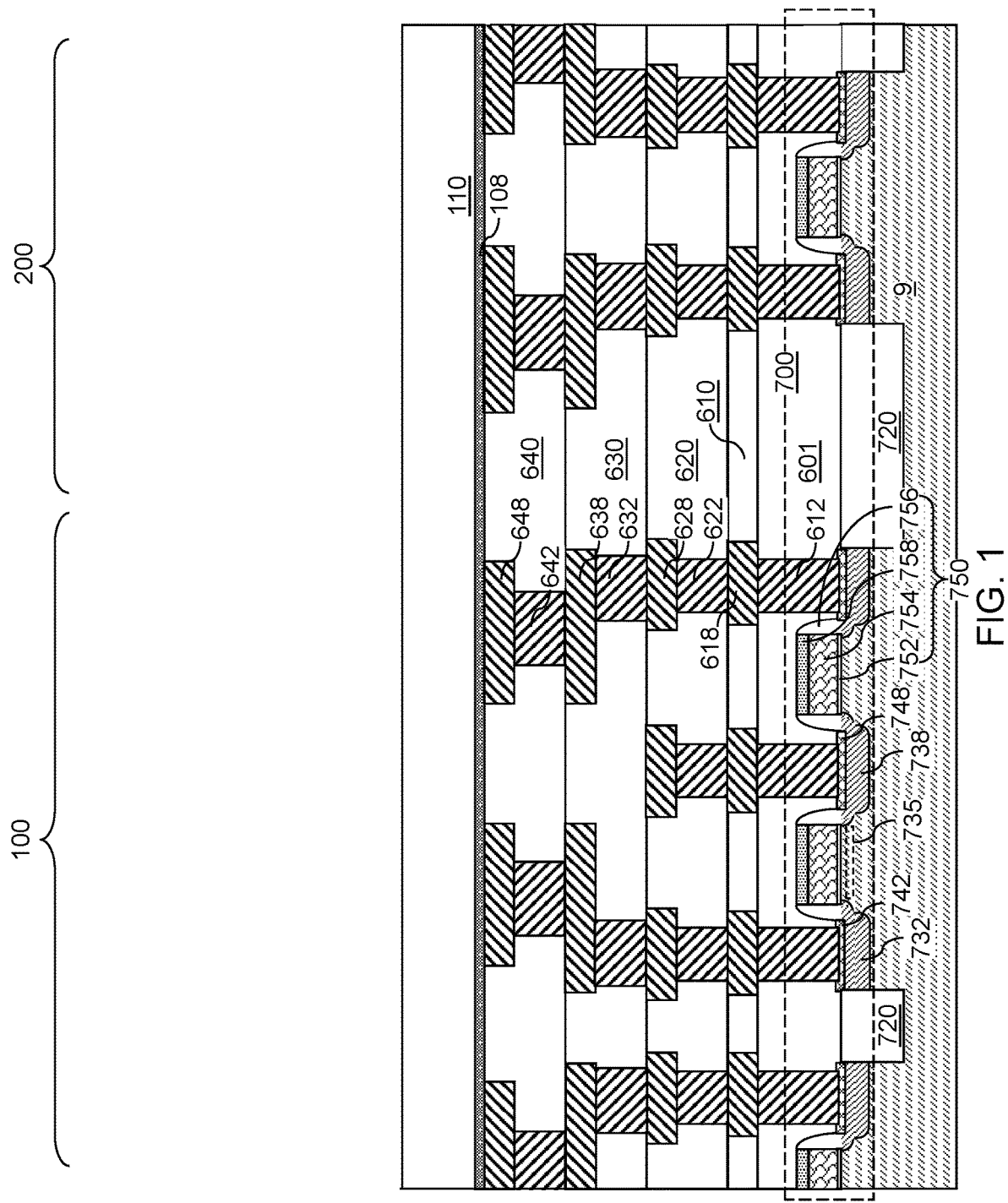
FIG. 1 is a vertical cross-sectional view of a first exemplary structure after formation of complementary metal-oxide-semiconductor (CMOS) transistors, metal interconnect structures embedded in dielectric material layers, and a connection-via-level dielectric layer according to a first embodiment of the present disclosure.

Referring to FIG. 1, a first exemplary structure according to a first embodiment of the present disclosure is illustrated. The first exemplary structure includes complementary metal-oxide-semiconductor (CMOS) transistors formed on a semiconductor substrate such as a single crystalline silicon substrate, and metal interconnect structures formed in dielectric material layers. Specifically, the first exemplary structure includes a substrate 9, which may be a semiconductor substrate such as a commercially available silicon wafer. Shallow trench isolation structures 720 including a dielectric material such as silicon oxide may be formed in an upper portion of the substrate 9. Suitable doped semiconductor wells, such as p-type wells and n-type wells, may be formed within each area that is laterally enclosed by a portion of the shallow trench isolation structures 720. Field effect transistors may be formed over the top surface of the substrate 9. For example, each field effect transistor may include a source region 732, a drain region 738, a semiconductor channel 735 that includes a surface portion of the substrate 9 extending between the source region 732 and the drain region 738, and a gate structure 750. Each gate structure 750 may include a gate dielectric 752, a gate electrode 754, a gate cap dielectric 758, and a dielectric gate spacer 756. A source-side metal-semiconductor alloy region 742 may be formed on each source region 732, and a drain-side metal-semiconductor alloy region 748 may be formed on each drain region 738.

Generally, field effect transistors may be formed on a semiconductor substrate, electrodes of memory devices to be subsequently formed may be electrically connected to the a respective one of the field effect transistors through metal interconnect structures that are formed above the semiconductor substrate within interconnect-level dielectric material layers. For example, the first exemplary structure may include a memory array region 100 in which an array of memory elements is subsequently formed, and a peripheral region 200 in which logic devices that support operation of the array of memory elements are formed. In one embodiment, devices (such as field effect transistors) in the memory array region 100 may include bottom electrode access transistors that provide access to bottom electrodes of memory cells to be subsequently formed. Top electrode access transistors that provide access to top electrodes of memory cells to be subsequently formed may be formed in the peripheral region 200 at this processing step. Devices (such as field effect transistors) in the peripheral region 200 may provide functions that are needed to operate the array of memory cells to be subsequently formed. Specifically, devices in the peripheral region may be configured to control the programming operation, the erase operation, and the sensing (read) operation of the array of memory cells. For example, the devices in the peripheral region may include a sensing circuitry and/or a top electrode bias circuitry. The devices formed on the top surface of the substrate 9 may include complementary metal-oxide-semiconductor (CMOS) transistors and optionally additional semiconductor devices (such as resistors, diodes, capacitors, etc.), and are collectively referred to as CMOS circuitry 700.

Various metal interconnect structures embedded in dielectric material layers may be subsequently formed over the substrate 9 and the devices (such as field effect transistors). The dielectric material layers may include, for example, a contact-level dielectric material layer 601, a first metal-line-level dielectric material layer 610, a second line-and-via-level dielectric material layer 620, a third line-and-via-level dielectric material layer 630, and a fourth line-and-via-level dielectric material layer 640. The metal interconnect structures may include device contact via structures 612 formed in the contact-level dielectric material layer 601 and contact a respective component of the CMOS circuitry 700, first metal line structures 618 formed in the first metal-line-level dielectric material layer 610, first metal via structures 622 formed in a lower portion of the second line-and-via-level dielectric material layer 620, second metal line structures 628 formed in an upper portion of the second line-and-via-level dielectric material layer 620, second metal via structures 632 formed in a lower portion of the third line-and-via-level dielectric material layer 630, third metal line structures 638 formed in an upper portion of the third line-and-via-level dielectric material layer 630, third metal via structures 642 formed in a lower portion of the fourth line-and-via-level dielectric material layer 640, and fourth metal line structures 648 formed in an upper portion of the fourth line-and-via-level dielectric material layer 640. In one embodiment, the second metal line structures 628 may include source lines that are connected to a source-side power supply for an array of memory elements. The voltage provided by the source lines may be applied to the bottom electrodes through the access transistors provided in the memory array region 100.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638, 642, 648) may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable materials within the contemplated scope of disclosure may also be used. In one embodiment, the first metal via structures 622 and the second metal line structures 628 may be formed as integrated line and via structures by a dual damascene process, the second metal via structures 632 and the third metal line structures 638 may be formed as integrated line and via structures, and/or the third metal via structures 642 and the fourth metal line structures 648 may be formed as integrated line and via structures. While the present disclosure is described using an embodiment in which an array of memory cells formed over the fourth line-and-via-level dielectric material layer 640, embodiments are expressly contemplated herein in which the array of memory cells may be formed at a different metal interconnect level.

The dielectric material layers (601, 610, 620, 630, 640) are located at a lower level relative to an array of memory cells to be subsequently formed. As such, the dielectric material layers (601, 610, 620, 630, 640) are herein referred to as lower-level dielectric layers, i.e., dielectric material layer located at a lower level relative to the array of memory cells to be subsequently formed. The metal interconnect structures (612, 618, 622, 628, 632, 638, 642, 648) are herein referred to lower-level metal interconnect structures. A subset of the metal interconnect structures (612, 618, 622, 628, 632, 638, 642, 648) includes lower-level metal lines (such as the fourth metal line structures 648) that are embedded in the lower-level dielectric layers and having top surfaces within a horizontal plane including a topmost surface of the lower-level dielectric layers. Generally, the total number of metal line levels within the lower-level dielectric layers (601, 610, 620, 630, 640) may be in a range from 1 to 10.

A dielectric cap layer 108 and a connection-via-level dielectric layer 110 may be sequentially formed over the metal interconnect structures and the dielectric material layers. For example, the dielectric cap layer 108 may be formed on the top surfaces of the fourth metal line structures 648 and on the top surface of the fourth line-and-via-level dielectric material layer 640. The dielectric cap layer 108 includes a dielectric capping material that may protect underlying metal interconnect structures such as the fourth metal line structures 648. In one embodiment, the dielectric cap layer 108 may include a material that may provide high etch resistance, i.e., a dielectric material and also may function as an etch stop material during a subsequent anisotropic etch process that etches the connection-via-level dielectric layer 110. For example, the dielectric cap layer 108 may include silicon carbide or silicon nitride, and may have a thickness in a range from 5 nm to 30 nm, although lesser and greater thicknesses may also be used.

The connection-via-level dielectric layer 110 may include any material that may be used for the dielectric material layers (601, 610, 620, 630, 640). For example, the connection-via-level dielectric layer 110 may include undoped silicate glass or a doped silicate glass deposited by decomposition of tetraethylorthosilicate (TEOS). The thickness of the connection-via-level dielectric layer 110 may be in a range from 50 nm to 200 nm, although lesser and greater thicknesses may also be used. The dielectric cap layer 108 and the connection-via-level dielectric layer 110 may be formed as planar blanket (unpatterned) layers having a respective planar top surface and a respective planar bottom surface that extends throughout the memory array region 100 and the peripheral region 200.

Figure 2:
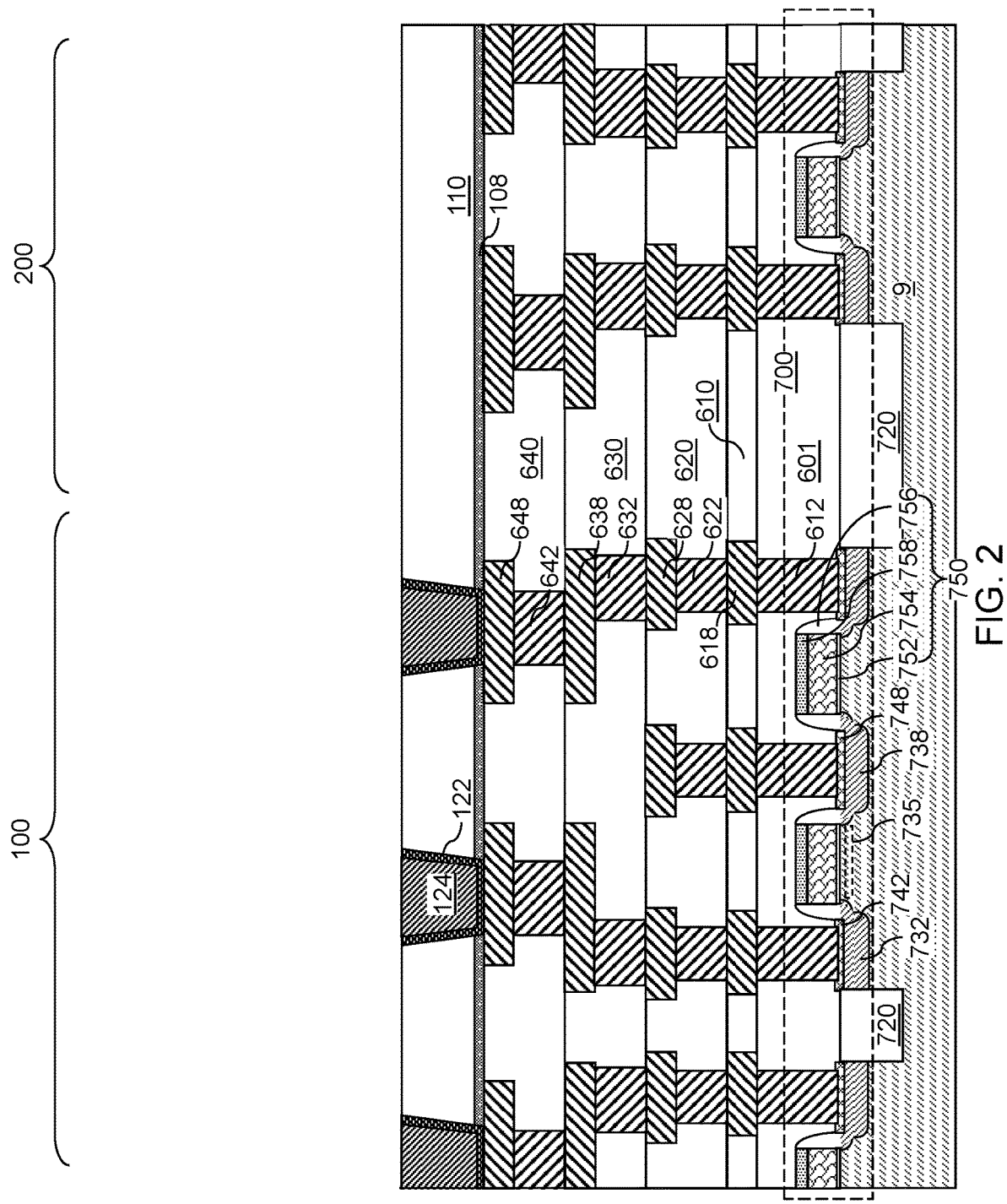
FIG. 2 is a vertical cross-sectional view of the first exemplary structure after formation of an array of connection via structures according to the first embodiment of the present disclosure.

Referring to FIG. 2, via cavities may be formed through the connection-via-level dielectric layer 110 and the dielectric cap layer 108. For example, a photoresist layer (not shown) may be applied over the connection-via-level dielectric layer 110 and may be patterned to form opening within areas of the memory array region 100 that overlie a respective one of the fourth metal line structures 648. An anisotropic etch may be performed to transfer the pattern in the photoresist layer through the connection-via-level dielectric layer 110 and the dielectric cap layer 108. The via cavities formed by the anisotropic etch process are herein referred to as lower-electrode-contact via cavities because bottom electrode connection via structures are subsequently formed in the lower-electrode-contact via cavities. The lower-electrode-contact via cavities may have tapered sidewalls having a taper angle (with respective to a vertical direction) in a range from 1 degree to 10 degrees. A top surface of a fourth metal line structure 648 may be physically exposed at the bottom of each lower-electrode-contact via cavity. The photoresist layer may be subsequently removed, for example, by ashing.

A metallic barrier layer may be formed as a material layer. The metallic barrier layer may cover physically exposed top surfaces of the fourth metal line structures 648, tapered sidewalls of the lower-electrode-contact via cavities, and the top surface of the connection-via-level dielectric layer 110 without any hole therethrough. The metallic barrier layer may include a conductive metallic nitride such as TiN, TaN, and/or WN. Other suitable materials within the contemplated scope of disclosure may also be used. The thickness of the metallic barrier layer may be in a range from 3 nm to 20 nm, although lesser and greater thicknesses may also be used.

A metallic fill material such as tungsten or copper may be deposited in remaining volumes of the lower-electrode-contact via cavities. Other suitable metallic fill materials are within the contemplated scope of disclosure. Portions of the metallic fill material and the metallic barrier layer that overlie the horizontal plane including the topmost surface of the connection-via-level dielectric layer 110 may be removed by a planarization process such as chemical mechanical planarization. Each remaining portion of the metallic fill material located in a respective via cavity comprises a metallic via fill material portion 124. Each remaining portion of the metallic barrier layer in a respective via cavity comprises a metallic barrier layer 122. Each combination of a metallic barrier layer 122 and a metallic via fill material portion 124 that fills a via cavity constitutes a connection via structure (122, 124). An array of connection via structures (122, 124) may be formed in the connection-via-level dielectric layer 110 on underlying metal interconnect structures. The array of connection via structures (122, 124) may contact top surfaces of a subset of the fourth metal line structures 648. Generally, the array of connection via structures (122, 124) contacts top surfaces of a subset of lower-level metal lines located at the topmost level of the lower-level dielectric layers (601, 610, 620, 630, 640). In one embodiment, the array of connection via structures (122, 124) may be used as first metal interconnect structures providing electrical connection to a first electrode of each memory cell to be subsequently formed.

Alternatively, formation of the dielectric cap layer 108, the connection-via-level dielectric layer 110, and the array of connection via structures (122, 124) may be omitted, and a subset of metal line structures embedded in a line-and-via-level dielectric layer or in a line-level dielectric layer may be used as first metal interconnect structures providing electrical connection to a first electrode of each memory cell to be subsequently formed. For example, a subset of the fourth metal line structures 648 embedded in the fourth line-and-via-level dielectric material layer 640 and located in the memory array region 100 may be used as the first metal interconnect structures providing electrical connection to a first electrode of each memory cell to be subsequently formed. Generally, first metal interconnect structures that are configured to provide electrical connection to a first electrode (such as a bottom electrode) of each memory cell to be subsequently formed may be provided. The first metal interconnect structures may be provided as metal lines (such as a one-dimensional periodic array of metal lines that extend along a common horizontal direction), or may be provided as metal via structures such as a two-dimensional array of connection via structures (122, 124). Generally, each first metal interconnect structure may be embedded within a first dielectric material layer such as the connection-via-level dielectric layer 110 (in embodiments in which a two-dimensional array of connection via structures (122, 124) is used), a dielectric material layer that embeds metal lines (such as the fourth line-and-via-level dielectric material layer 640). Each bottom surface of a first electrode may be subsequently formed on a top surface of a respective one of the first metal interconnect structures.

While the present disclosure is described using an embodiment in which the connection-via-level dielectric layer 110 is used as the first dielectric material layer and the array of connection via structures (122, 124) is used as first metal interconnect structures, embodiments are expressly contemplated herein in which an array of via structures located at a different level or an array of metal lines is used as the first metal interconnect structures.

Figure 3:
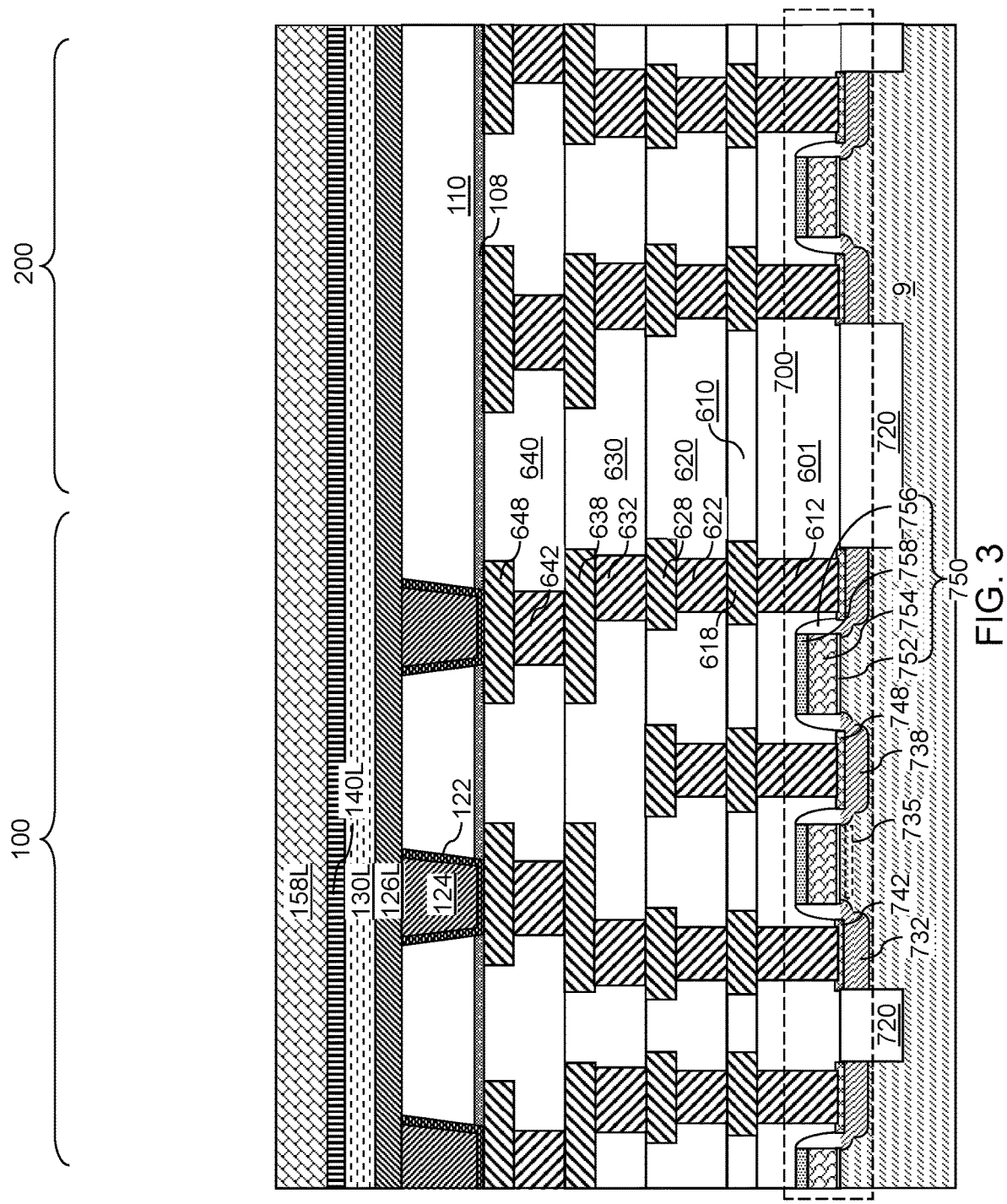
FIG. 3 is a vertical cross-sectional view of the first exemplary structure after formation of a first electrode material layer, a memory material layer stack, and a second electrode material layer according to the first embodiment of the present disclosure.

Referring to FIG. 3, a first electrode material layer 126L, a memory material layer stack (130L, 140L), and a second electrode material layer 158L may be sequentially deposited over the top surface of a first dielectric material layer (such as the connection-via-level dielectric layer 110) that embeds the array of connection via structures (122, 124).

The first electrode material layer 126L may include, and/or may consist essentially of, a conductive metallic nitride material and/or an elemental metal and/or an intermetallic alloy. Conductive metallic nitride materials may include a metallic diffusion barrier material that may block diffusion of hydrogen. For example, conductive metallic nitride materials that may be used for the first electrode material layer 126L include TiN, TaN, or WN. Elemental metals that may be used for the first electrode material layer 126L include, but are not limited to, W, Ta, Re, Nb, Mb, Ru, Co, and Ni. Generally, an elemental metal that is resistant to hydrogen diffusion may be used for the first electrode material layer 126L. In one embodiment, a refractory metal having a melting point higher than 2,000 degrees Celsius may be used for the first electrode material layer 126L. Generally, elemental metals having a high melting point tends to provide low bulk diffusion coefficient for gases due to relatively tight binding between atoms.

The first electrode material layer 126L may be deposited by physical vapor deposition or chemical vapor deposition. The thickness of the first electrode material layer 126L may be in a range from 1 nm to 100 nm, such as from 2 nm to 50 nm and/or from 4 nm to 20 nm, although lesser and greater thicknesses may also be used. A stack of multiple metal layers may be used as the first electrode material layer 126L.

The memory material layer stack includes at least one semiconducting metal oxide material layer 130L and at least one hydrogen-containing metal layer 140L. Generally, the at least one semiconducting metal oxide material layer 130L may be a single semiconducting metal oxide material layer 130L or a plurality of semiconducting metal oxide material layers 130L that may be vertically spaced apart by the at least one hydrogen-containing metal layer 140L. The at least one hydrogen-containing metal layer 140L may be a single hydrogen-containing metal layer 140L or a plurality of hydrogen-containing metal layers 140L that may be vertically spaced apart by the at least one semiconducting metal oxide material layer 130L. In one embodiment, a single semiconducting metal oxide material layer 130L and a single hydrogen-containing metal layer 140L may be present in the memory material layer stack. In this embodiment, the single hydrogen-containing metal layer 140L may overlie, or underlie, the single semiconducting metal oxide material layer 130L. In another embodiment, a single semiconducting metal oxide material layer 130L and two hydrogen-containing metal layers 140L may be present in the memory material layer stack. In this embodiment, the single semiconducting metal oxide material layer 130L may be located between the two hydrogen-containing metal layers 140L. In yet another embodiment, two semiconducting metal oxide material layers 130L and a single hydrogen-containing metal layer 140L may be present in the memory material layer stack. In this embodiment, the single hydrogen-containing metal layer 140L may be located between the two semiconducting metal oxide material layers 130L. In still another embodiment, at least two semiconducting metal oxide material layers 130L and at least two hydrogen-containing metal layers 140L may be present in the memory material layer stack. In this embodiment, the at least two semiconducting metal oxide material layers 130L and the at least two hydrogen-containing metal layers 140L may be arranged as a vertically alternating sequence in which each vertically neighboring pair of layers include a respective semiconducting metal oxide material layer 130L and a respective hydrogen-containing metal layer 140L.

Each semiconducting metal oxide material layer 130L includes a semiconducting metal oxide material, i.e., a metal oxide material that is capable of providing electrical conductivity in a range from 1.0 S/m to $1.0 \times 10$ S/m upon suitable doping with electrical dopants (which may be p-type dopants or n-type dopants). In an intrinsic state or under a condition of a low-level electrical doping, a semiconducting metal oxide material may be semiconducting or insulating, and may have electrical conductivity generally in a range from $1.0 \times 10^{-10}$ S/m to $1.0 \times 10$ S/m. Exemplary semiconducting metal oxide materials that may be used for the at least one semiconducting metal oxide material layer 130L include, but are not limited to, indium gallium zinc oxide (IGZO), indium tungsten oxide, indium zinc oxide, indium tin oxide, gallium oxide, indium oxide, doped zinc oxide, doped indium oxide, doped cadmium oxide, and various other doped variants derived therefrom. In one embodiment, the semiconducting metal oxide material layer 130L may include indium gallium zinc oxide.

The semiconducting metal oxide material of each semiconducting metal oxide material layer 130L may be deposited, for example, by physical vapor deposition (i.e., sputtering). The semiconducting metal oxide material of each semiconducting metal oxide material layer 130L may be deposited as a polycrystalline material, or may be deposited as an amorphous material and may be subsequently annealed at an elevated temperature into a polycrystalline material in order to increase the average grain size of the semiconducting metal oxide material. The thickness of each semiconducting metal oxide material layer 130L may be in a range from 2 nm to 100 nm, such as from 4 nm to 50 nm and/or from 6 nm to 25 nm, although lesser and greater thicknesses may also be used.

Each hydrogen-containing metal layer 140L may include, and/or may consist essentially of, at least one of the platinum metals (i.e., platinum, iridium, osmium, ruthenium, or combinations thereof) and hydrogen atoms. Platinum metals refer to platinum, iridium, osmium, and ruthenium, each of which does not form metal hydrides under normal hydride-forming conditions, such as conditions in which hydrogen partial pressure is in a range from 1 kbar to 50 kbar. The metallic component of the hydrogen-containing metal layer 140L may consist essentially of at least one metal selected from platinum, iridium, osmium, and ruthenium. In one embodiment, the metallic component of the hydrogen-containing metal layer 140L may consist essentially of platinum.

Each hydrogen-containing metal layer 140L may be formed by physical vapor deposition in vacuum or in an environment including hydrogen. The hydrogen partial pressure during the deposition process may be maintained at a level that does not impede the deposition process such as a physical vapor deposition process. In one embodiment, the hydrogen partial pressure during deposition of each hydrogen-containing metal layer 140L may be in a range from $1.0 \times 10^{-10}$ Torr to $1.0 \times 10^{-3}$ ton. Alternatively, the hydrogen-containing metal layer 140L may be deposited in a hydrogen-free environment or in a low hydrogen pressure environment, and may be annealed at an elevated temperature in a hydrogen-containing environment. In this embodiment, the anneal temperature may be in a range from 200 degrees Celsius to 500 degrees Celsius, such as from 300 degrees Celsius to 400 degrees Celsius, and the hydrogen partial pressure during the anneal process may be in a range from 100 mTorr to 760 Ton. Alternatively or additionally, hydrogen atoms may be implanted into each hydrogen-containing metal layer 140L after deposition of at least one of platinum, iridium, osmium, and ruthenium in a hydrogen-free environment or in a low hydrogen pressure environment.

The various processing parameters affecting hydrogen incorporation into each hydrogen-containing metal layer 140L may be selected such that the atomic percentage of hydrogen atoms in each hydrogen-containing metal layer 140L is in a range from 0.001% to 10%, such as from 0.01% to 5% and/or from 0.1% to 3%. The various processing parameters that affect the atomic percentage of hydrogen atoms in each hydrogen-containing metal layer 140L include, but are not limited to, the dose of the hydrogen atoms during the hydrogen implantation process, the partial pressure of hydrogen during an anneal process in a hydrogen-containing environment, and the temperature and the duration of the anneal process. In one embodiment, hydrogen implantation may be used to provide a high atomic percentage of hydrogen in each hydrogen-containing metal layer 140L. In this embodiment, each hydrogen-containing metal layer 140L may include hydrogen atoms at an atomic percentage greater than 1.0 percent, such as a percentage in a range from 1.0 percent to 10%.

Each hydrogen-containing metal layer 140L may include at least one metal selected from platinum, iridium, osmium, and ruthenium at an atomic percentage that is at least 90%, and include hydrogen atoms at an atomic percentage in a range from 0.001% to 10% after incorporation of hydrogen. In one embodiment, each hydrogen-containing metal layer 140L may include hydrogen atoms at an atomic percentage in a range from 0.001% to 10% after incorporation of hydrogen, and the balance of the atomic percentage may be the atomic percentage of the at least one metal selected from platinum, iridium, osmium, and ruthenium. In one embodiment, the at least one metal selected from platinum, iridium, osmium, and ruthenium may be platinum. In this embodiment, each hydrogen-containing metal layer 140L may include hydrogen atoms at an atomic percentage in a range from 0.001% to 10% after incorporation of hydrogen, and the atomic percentage of platinum may be the balance of the atomic percentage of hydrogen atoms.

The thickness of each hydrogen-containing metal layer 140L may be in a range from 2 nm to 100 nm, such as from 4 nm to 50 nm and/or from 6 nm to 25 nm, although lesser and greater thicknesses may also be used. Each hydrogen-containing metal layer 140L does not include any hydride of metal, i.e., an MH compound in which M is a metal and hydrogen atoms take up substitutional sites of a lattice structure. As such, a predominant portion, or all, of the hydrogen atoms that are present within each hydrogen-containing metal layer 140L are located at interstitial sites.

The second electrode material layer 158L may include, and/or may consist essentially of, a conductive metallic nitride material and/or an elemental metal and/or an intermetallic alloy. Conductive metallic nitride materials may include a metallic diffusion barrier material that may block diffusion of hydrogen. For example, conductive metallic nitride materials that may be used for the second electrode material layer 158L include TiN, TaN, or WN. Elemental metals that may be used for the second electrode material layer 158L include, but are not limited to, W, Ta, Re, Nb, Mb, Ru, Co, and Ni. Generally, an elemental metal that is resistant to hydrogen diffusion may be used for the second electrode material layer 158L. In one embodiment, a refractory metal having a melting point higher than 2,000 degrees Celsius may be used for the second electrode material layer 158L. Generally, elemental metals having a high melting point tends to provide low bulk diffusion coefficient for gases due to relatively tight binding between atoms.

The second electrode material layer 158L may be deposited by physical vapor deposition or chemical vapor deposition. The thickness of the second electrode material layer 158L may be in a range from 1 nm to 100 nm, such as from 2 nm to 50 nm and/or from 4 nm to 20 nm, although lesser and greater thicknesses may also be used. A stack of multiple metal layers may be used as the second electrode material layer 158L. The metallic material of the second electrode material layer 158L may be the same as, or may be different from, the metallic material of the first electrode material layer 126L.

Figure 4:
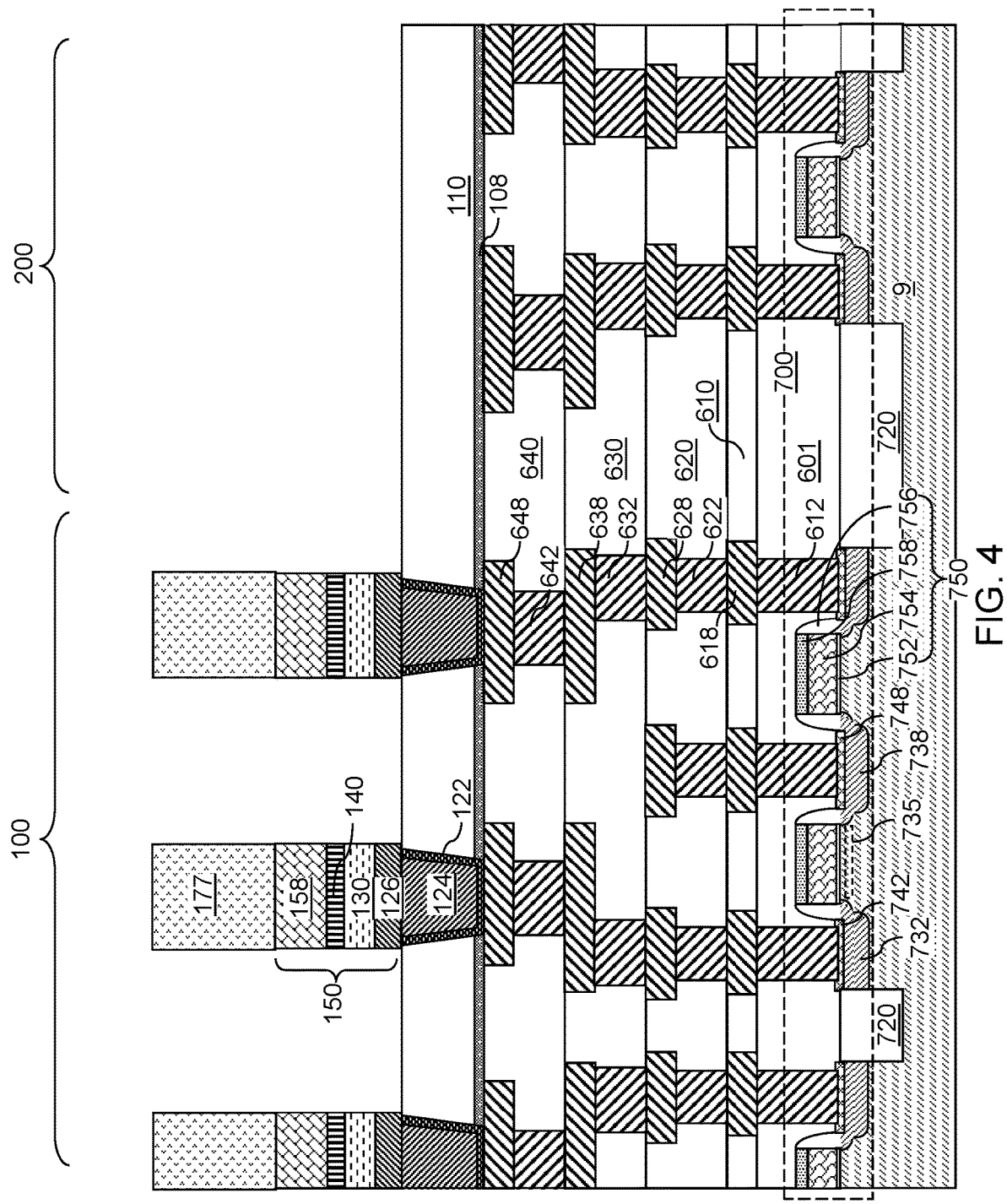
FIG. 4 is a vertical cross-sectional view of the first exemplary structure after patterning pillar structures including a first electrode, a memory layer stack, and a second electrode according to the first embodiment of the present disclosure.

Referring to FIG. 4, a photoresist layer 177 may be applied over the second electrode material layer 158L, and may be lithographically patterned into an array of discrete photoresist material portions in the memory array region 100. Each patterned portion of the photoresist layer 177 may overlie a respective one of the connection via structures (122, 124). The sidewall(s) of each patterned portion of the photoresist layer 177 may coincide with, may be laterally offset outward from, or may be laterally offset inward from, the periphery of a top surface of an underlying connection via structure (122, 124). The sidewall(s) of each patterned portion of the photoresist layer 177 may have a horizontal cross-sectional shape of a circle, an ellipse, a rectangle, a rounded rectangle, or of any generally curvilinear closed two-dimensional shape.

An anisotropic etch process may be performed to etch unmasked portions of the second electrode material layer 158L, the memory material layer stack (130L, 140L), and the first electrode material layer 126L. Each patterned portion of the second electrode material layer 158L comprises a second electrode 158. Each patterned portion of the memory material layer stack (130L, 140L) comprises a memory layer stack (130, 140). Each patterned portion of the first electrode material layer 126L comprises a first electrode 126. A set of remaining material portions derived from the material layer stack including the second electrode material layer 158L, the memory material layer stack (130L, 140L), and the first electrode material layer 126L constitutes a memory cell 150. Each memory cell 150 may be a pillar structure having a planar top surface, a planar bottom surface, and at least one straight sidewall extending between the planar top surface and the planar bottom surface. The at least one straight sidewall may be a single sidewall (such as a circular cylindrical sidewall), or a plurality of straight sidewalls (such as four planar sidewalls of a rectangular pillar structure, or a combination of four planar sidewalls and four convex cylindrical sidewalls of a pillar structure having a horizontal cross-sectional shape of a rounded rectangle).

Generally, each combination of a first electrode 126, a memory layer stack (130, 140), and a second electrode 158 may comprise a pillar structure having a top surface that is a top surface of the second electrode 158, having a bottom surface that is a bottom surface of the first electrode 126, and having a sidewall that extends straight between a periphery of the top surface of the second electrode 158 and a periphery of the bottom surface of the first electrode 126.

Each memory layer stack includes at least one semiconducting metal oxide layer 130 and at least one hydrogen-containing metal layer 140. Each semiconducting metal oxide layer 130 is a patterned portion of a respective semiconducting metal oxide material layer 130L as formed at the processing steps of FIG. 3. Each hydrogen-containing metal layer 140 is a patterned portion of a respective hydrogen-containing metal layer 140L as formed at the processing steps of FIG. 3. Generally, the at least one semiconducting metal oxide layer 130 may be a single semiconducting metal oxide layer 130 or a plurality of semiconducting metal oxide layers 130 that are vertically spaced apart by the at least one hydrogen-containing metal layer 140. The at least one hydrogen-containing metal layer 140 may be a single hydrogen-containing metal layer 140 or a plurality of hydrogen-containing metal layers 140 that are vertically spaced apart by the at least one semiconducting metal oxide layer 130. In one embodiment, a single semiconducting metal oxide layer 130 and a single hydrogen-containing metal layer 140 may be present in the memory layer stack. In this embodiment, the single hydrogen-containing metal layer 140 may overlie, or underlie, the single semiconducting metal oxide layer 130. In another embodiment, a single semiconducting metal oxide layer 130 and two hydrogen-containing metal layers 140 may be present in the memory layer stack. In this embodiment, the single semiconducting metal oxide layer 130 may be located between the two hydrogen-containing metal layers 140. In yet another embodiment, two semiconducting metal oxide layers 130 and a single hydrogen-containing metal layer 140 may be present in the memory layer stack. In this embodiment, the single hydrogen-containing metal layer 140 may be located between the two semiconducting metal oxide layers 130. In still another embodiment, at least two semiconducting metal oxide layers 130 and at least two hydrogen-containing metal layers 140 may be present in the memory layer stack. In this embodiment, the at least two semiconducting metal oxide layers 130 and the at least two hydrogen-containing metal layers 140 may be arranged as a vertically alternating sequence in which each vertically neighboring pair of layers include a respective semiconducting metal oxide layer 130 and a respective hydrogen-containing metal layer 140.

A two-dimensional array of memory cells 150 may be provided. Each memory cell 150 may include, from bottom to top, a first electrode 126, a memory layer stack is located on the first electrode 126 and including at least one semiconducting metal oxide layer 130 and at least one hydrogen-containing metal layer 140, and a second electrode 158 located over the memory layer stack. The first electrode 126 may be a first metallic electrode consisting essentially of at least one metallic material. The second electrode 158 may be a second metallic electrode consisting essentially of at least one metallic material. Each of the at least one hydrogen-containing metal layer may comprise, and/or may consist essentially of, at least one metal selected from platinum, iridium, osmium, and ruthenium at an atomic percentage that is at least 90%, and comprises, and/or consists essentially of, hydrogen atoms at an atomic percentage in a range from 0.001% to 10%.

In one embodiment, each of the at least one semiconducting metal oxide layer 130 contacts a horizontal surface of a respective one of the at least one hydrogen-containing metal layer 140 within each memory layer stack. In one embodiment, the memory layer stack may comprise, and/or may consist essentially of, a single semiconducting metal oxide layer 130 and a single hydrogen-containing metal layer 140 that are in contact with each other. In one embodiment, the single semiconducting metal oxide layer 130 contacts one of the first electrode 126 and the second electrode 158, and the single hydrogen-containing metal layer 140 contacts another of the first electrode 126 and the second electrode 158. The photoresist layer 177 may be subsequently removed, for example, by ashing.

Figure 5:
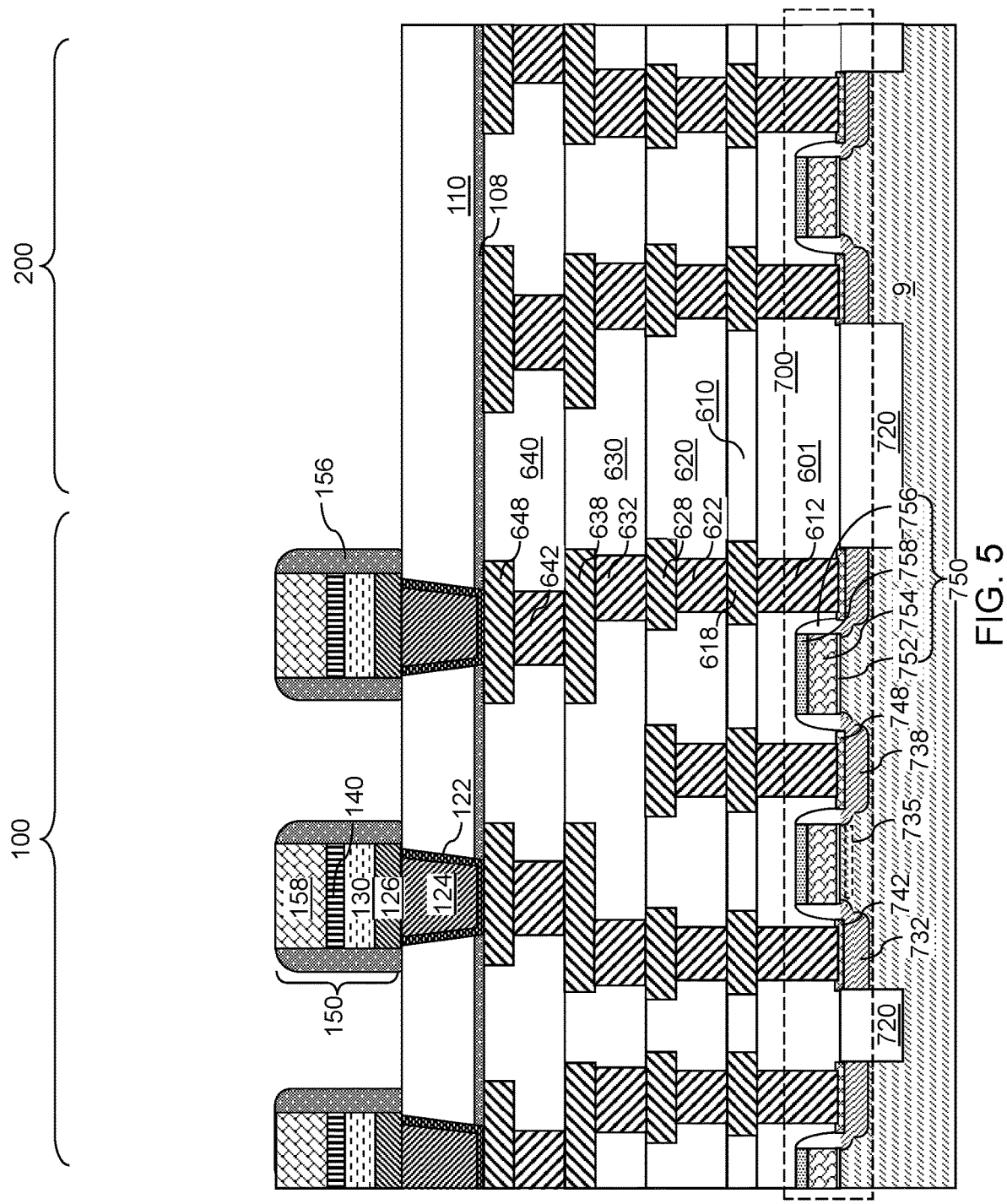
FIG. 5 is a vertical cross-sectional view of the first exemplary structure after formation of dielectric diffusion barrier spacers according to the first embodiment of the present disclosure.

Referring to FIG. 5, a dielectric diffusion barrier material layer may be conformally deposited over the two-dimensional array of memory cells 150 by a conformal deposition process such as a chemical vapor deposition process. The dielectric diffusion barrier material layer includes a hydrogen diffusion barrier material layer that blocks diffusion of hydrogen. For example, the dielectric diffusion barrier material may include silicon nitride. The thickness of the dielectric diffusion barrier material layer may be in a range from 5 nm to 50 nm, such as from 10 nm to 25 nm, although lesser and greater thicknesses may also be used.

An anisotropic etch process may be performed to remove horizontal portions of the dielectric diffusion barrier material layer. Remaining vertically-extending portions of the dielectric diffusion barrier material layer comprise dielectric diffusion barrier spacers 156 that contact, laterally surround, a respective pillar structure, which is a memory cell 150.

Each hydrogen-containing metal layer 140 functions as a hydrogen reservoir for one or two semiconducting metal oxide layers 130. The first electrode 126 and the second electrode 158 may include metallic materials that prevent diffusion of hydrogen atoms therethrough. The dielectric diffusion barrier spacers 156 function as an enclosure that prevents escape of hydrogen atoms from a respective memory cell 150.

Generally, the hydrogen atoms within each memory cell 150 may be moved between at least one hydrogen-containing metal layer 140 and at least one semiconducting metal oxide layer 130 by application of a programming pulse across the first electrode 126 and the second electrode 158. Thus, application of a first programming pulse of a first polarity to the second electrode 158 relative to the first electrode 126 may cause a selected memory cell 150 to be programmed into a hydrogenated state in which one or more, and/or all, of the at least one semiconducting metal oxide layer 130 includes hydrogen atoms at a high atomic concentration, which may be in a range from 0.001% to 10%, such as from 0.01% to 5% and/or from 0.1% to 3%. Application of a second programming pulse of a second polarity to the second electrode 158 relative to the first electrode 126 may cause a selected memory cell 150 to be programmed into a de-hydrogenated state in which one or more, and/or all, of the at least one semiconducting metal oxide layer 130 includes hydrogen atoms at a low atomic concentration, which may be in a range from 0.0001% to 3.3%, such as from 0.001% to 1.67% and/or from 0.01% to 1%. Generally, the ratio of the atomic percentage of hydrogen atoms in the hydrogenated state of a semiconducting metal oxide layer 130 to the atomic percentage of hydrogen atoms in the de-hydrogenated state of the semiconducting metal oxide layer 130 may be in a range from 3-100, such as from 5 to 10, although lesser and greater ratios may also be used.

Without wishing to be bound by any particular theory, it is believed that application of a negative voltage to one side of a metal (such as the first electrode 126 or the second electrode 158) containing hydrogen atoms has a tendency to attract hydrogen atoms because the hydrogen atoms are in a partial donor state in which a fraction of the negative charge of an electron may be donated to the common conduction band of the metal. The polarity of the programming pulses may be determined depending on which direction the hydrogen atoms need to be moved for the purpose of programming. The magnitude of the programming pulses depends on the thickness and the layer stack composition within each memory layer stack (130, 140). In an illustrative example, programming pulses having a magnitude in a range from 3 V to 30 V may be used. Because the resistance of the current path within each memory cell 150, i.e., the current path that extends between the first electrode 126 and the second electrode 158 across each layer within the memory layer stack (130, 140), is relatively high, the electrical current through each selected memory cell 150 under programming may be small, and the power consumption may be small despite relatively high operational voltages.

Presence of hydrogen atoms in each semiconducting metal oxide layer 130 increases the conductivity of the semiconducting metal oxide layer 130. Without wishing to be bound by any particular theory, it is believed that the hydrogen atoms lodged in the interstitial sites function as minor doners, and increase the conductivity of the material of the semiconducting metal oxide layer 130. Thus, the hydrogenated state and the de-hydrogenated state of each semiconducting metal oxide layer 130 may be distinguished by measuring the magnitude of the leakage current through each selected memory cell 150 between a respective first electrode 126 and the respective second electrode 158.

Figure 6:
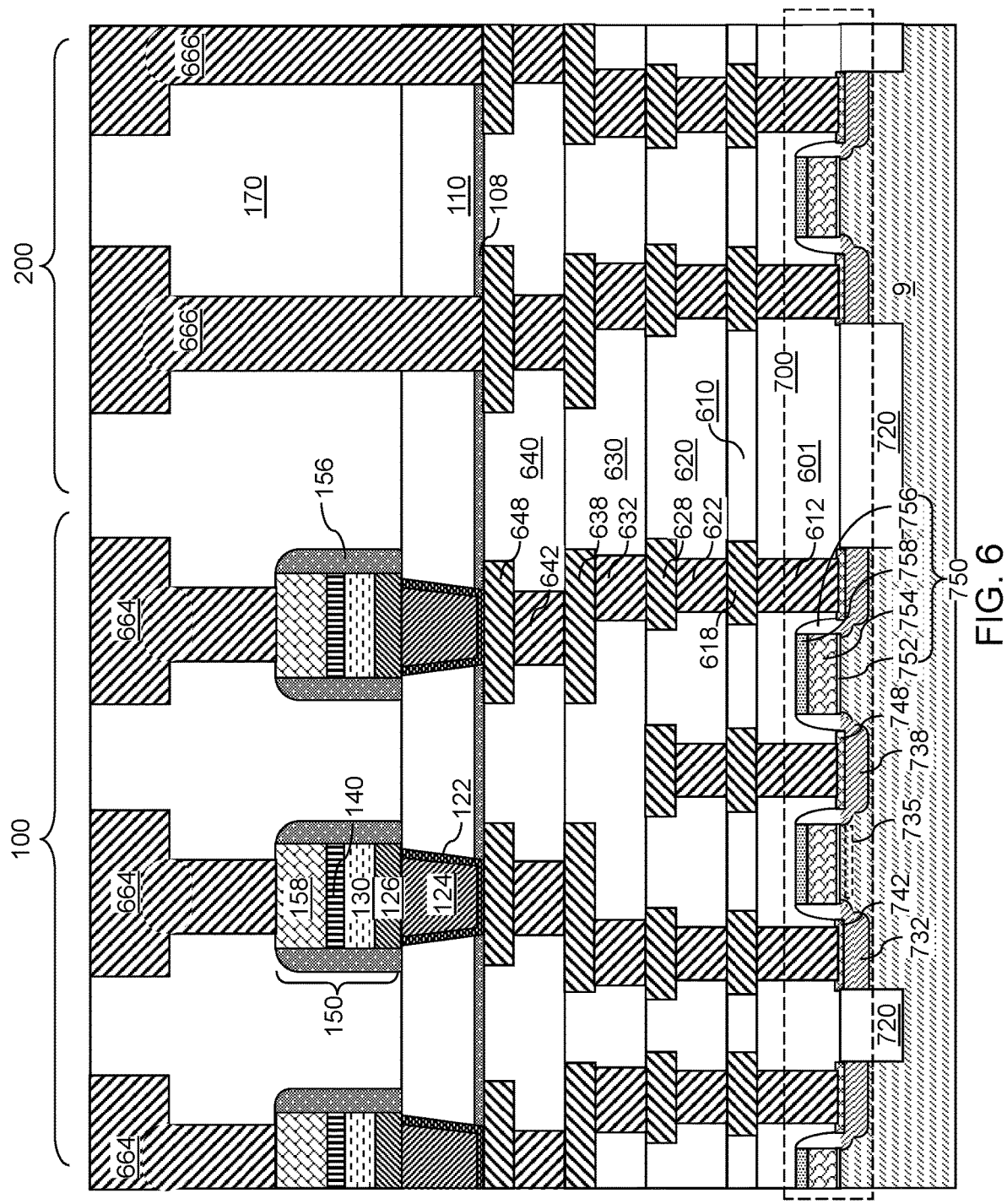
FIG. 6 is a vertical cross-sectional view of the first exemplary structure after formation of a memory-level dielectric layer and memory-level metal interconnect structures and planarization of the top electrodes according to the first embodiment of the present disclosure.

Referring to FIG. 6, a memory-level dielectric layer 170 may be formed around, and over, the array of memory cells 150 and the array of dielectric diffusion barrier spacers 156. The memory-level dielectric layer 170 includes a planarizable dielectric material such as undoped silicate glass or a doped silicate glass. The dielectric material of the memory-level dielectric layer 170 may be deposited by a conformal deposition process (such as a chemical vapor deposition process) or a self-planarizing deposition process (such as spin coating). Optionally, the top surface of the memory-level dielectric layer 170 may be planarized, for example, by chemical mechanical planarization. The vertical distance between the top surface of the memory-level dielectric layer 170 and the top surfaces of the memory cells 150 may be in a range from 50 nm to 500 nm, although lesser and greater vertical distances may also be used.

At least one lithographic patterning step and at least one anisotropic etch process may be used for form interconnect cavities in the memory-level dielectric layer 170. For example, a first photoresist layer (not shown) may be applied over the memory-level dielectric layer 170 and may be lithographically patterned to form an array of discrete openings in the first photoresist layer. A first anisotropic etch process may be performed to form via cavities in the memory-level dielectric layer 170. In one embodiment, a via cavity may be formed over each of the memory cells 150. After removal of the first photoresist layer, a second photoresist layer (not shown) may be applied over the memory-level dielectric layer 170, and may be lithographically patterned to form line-shaped openings in the second photoresist layer. A second anisotropic etch process may be performed to form line cavities in the memory-level dielectric layer 170. The second photoresist layer may be subsequently removed. In one embodiment, the interconnect cavities may be formed as integrated line and via cavities. In this embodiment, each integrated line and via cavity may include a line cavity that is located within an upper portion of the memory-level dielectric layer 170, and at least one via cavity adjoined to a bottom portion of the line cavity and vertically extends through a lower portion of the memory-level dielectric layer 170.

In one embodiment, a two-dimensional array of via cavities may be formed in the memory array region 100 such that each top surface of the memory cells 150 is physically exposed underneath a respective one of the via cavities within the two-dimensional array of via cavities. A top surface of an underlying metal interconnect structure, such as a fourth metal line structure 648 embedded in an upper portion of the fourth line-and-via-level dielectric material layer 640, may be physically exposed at the bottom of at least a subset of the interconnect cavities in the memory-level dielectric layer 170 in the peripheral region 200. Generally, at least a subset of the interconnect cavities vertically extending between the top surface of the memory-level dielectric layer 170 and the top surfaces of an underlying metal line structure may be formed through the memory-level dielectric layer 170 in the peripheral region 200.

At least one metallic material may be deposited in the interconnect cavities in the memory array region 100 and in the peripheral region 200. The at least one metallic material is herein referred to as at least one memory-level metallic material. In one embodiment, a metallic barrier material layer (such as a TiN layer, TaN layer, and/or a WN layer) and a metallic fill material (such as W, Cu, Co, Ru, Mo, or an intermetallic alloy) may be deposited in the interconnect cavities and over the memory-level dielectric layer 170.

A planarization process such as a chemical mechanical planarization process may be performed to remove the at least one memory-level metallic material from above the memory-level dielectric layer 170. Remaining portions of the at least one memory-level metallic material filling the interconnect cavities in the memory array region 100 comprise array-contact metal interconnect structures 664. Remaining portions of the at least one memory-level metallic material filling the interconnect cavities in the peripheral region 200 comprise peripheral metal interconnect structures 666. The array-contact metal interconnect structures 664 and the peripheral metal interconnect structure 666 are collectively referred to as memory-level metal interconnect structures.

Generally, first metal interconnect structures embedded within a first dielectric material layer may be formed prior to formation of a two-dimensional array of memory cells 150. Each first metal interconnect structure may contact a bottom surface of a respective first electrode 126 within the two-dimensional array of memory cells 150. Second metal interconnect structures (such as the array-contact metal interconnect structures 664) embedded within a second dielectric material layer (such as the memory-level dielectric layer 170) may be formed on a top surface of a respective one of the second electrodes 158. Generally, each first electrode 126 may be electrically connected to a node of an electrical switch, which may comprise one of the field effect transistors located on a semiconductor substrate (such as the substrate 9). Likewise, each second electrode 158 may be electrically connected to a node of an electrical switch, which may comprise another one of the field effect transistors located on a semiconductor substrate (such as the substrate 9).

Figure 7:
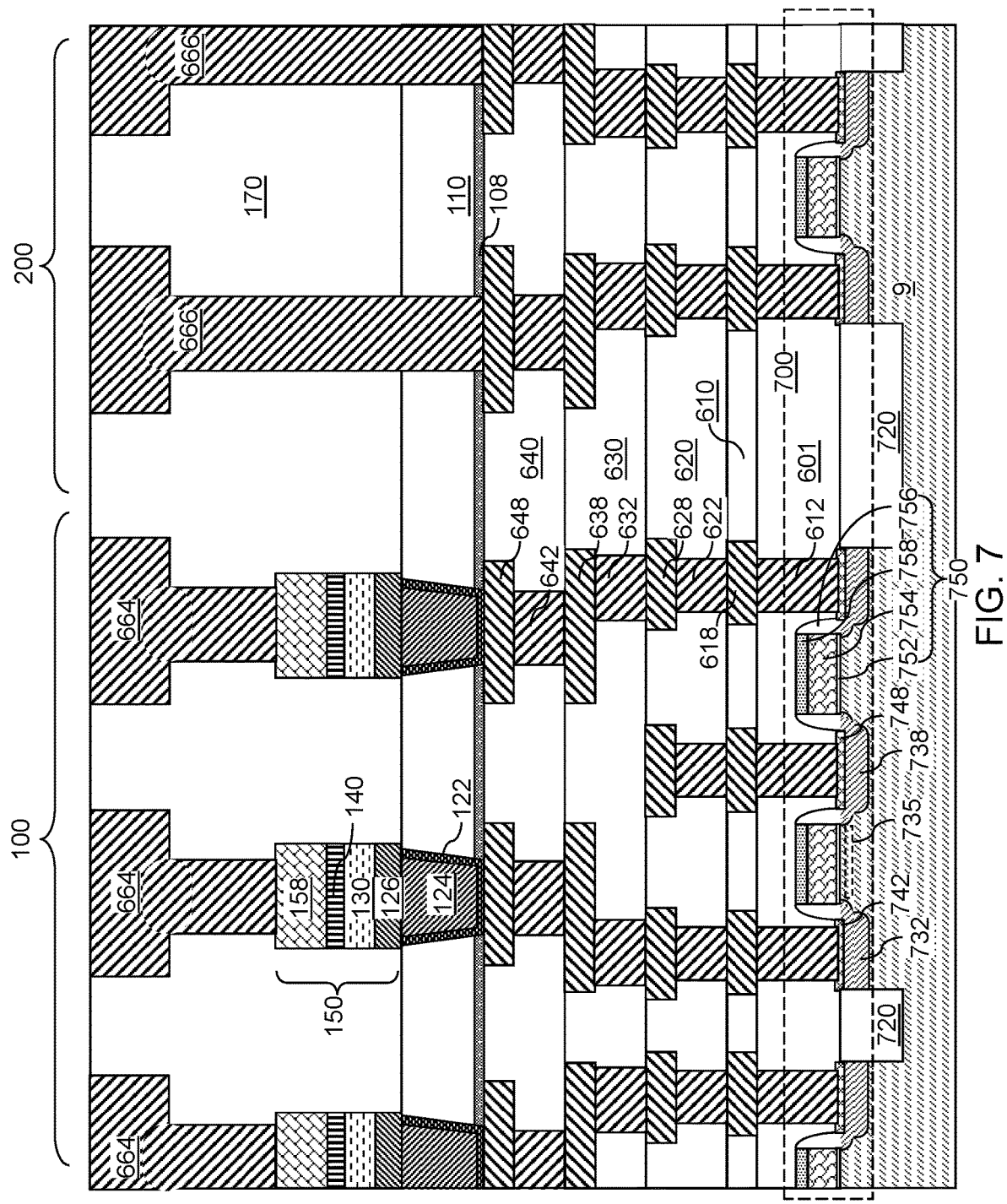
FIG. 7 is a vertical cross-sectional view of a first alternative configuration of the first exemplary structure according to the first embodiment of the present disclosure.

Referring to FIG. 7, a first alternative configuration of the first exemplary structure may be derived from the first exemplary structure illustrated in FIG. 6 by omitting formation of the dielectric diffusion barrier spacers 156. In this embodiment, the memory-level dielectric layer 170 may include a hydrogen diffusion blocking dielectric material such as silicon nitride. Alternatively, the memory-level dielectric layer 170 may include a layer stack containing a hydrogen diffusion barrier material liner (such as a silicon nitride liner) and an interlayer dielectric material layer (such as a layer of undoped silicate glass, a doped silicate glass, organosilicate glass, or a porous dielectric material).

Figure 8:
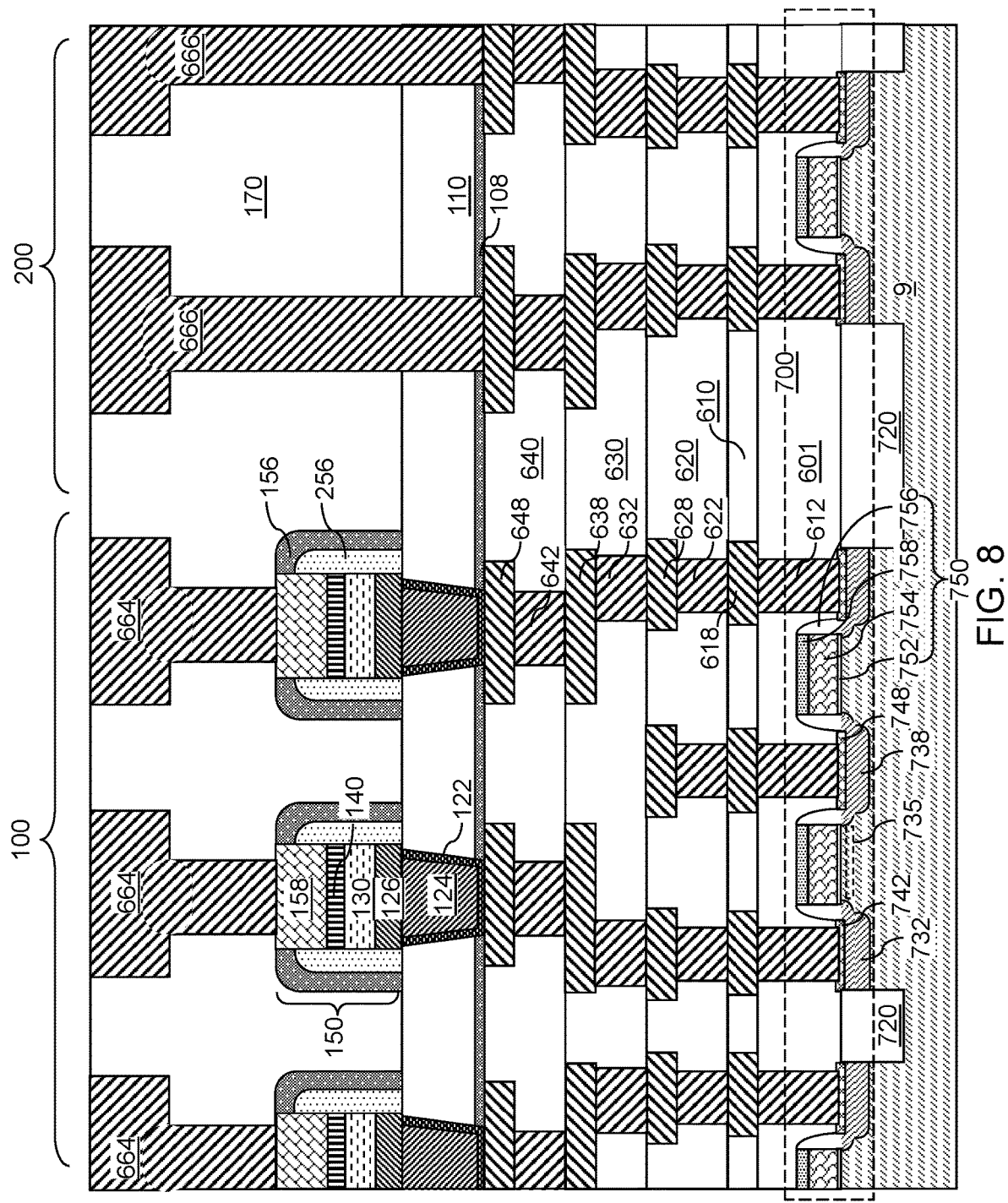
FIG. 8 is a vertical cross-sectional view of a second alternative configuration of the first exemplary structure according to the first embodiment of the present disclosure.

Referring to FIG. 8, a second alternative configuration of the first exemplary structure may be derived from the first exemplary structure by forming a combination of a permeable dielectric spacer 256 and a dielectric diffusion barrier spacer 156 in lieu of each dielectric diffusion barrier spacer 156. In this embodiment, a permeable dielectric material layer through which hydrogen atoms may permeate may be conformally formed after removing the photoresist layer 177 from the first exemplary structure illustrated in FIG. 4. The permeable dielectric material layer may include a dielectric material such as silicon oxide, organosilicate glass, or a porous dielectric material. An anisotropic etch may be performed to remove horizontal portions of the permeable dielectric material layer, and each remaining vertically-extending portion of the permeable dielectric material layer constitutes a permeable dielectric spacer 256. Each permeable dielectric spacer 256 may have a lateral thickness in a range from 1 nm to 50 nm, such as from 3 nm to 20 nm, between an inner sidewall and an outer sidewall, although lesser and greater thicknesses may also be used. The top surfaces of the permeable dielectric spacers 256 may be located below the horizontal plane including the top surfaces of the second electrodes 158 to facilitate coverage of the top portions of the permeable dielectric spacers 256 by dielectric diffusion barrier spacers 156 that are subsequently formed.

Subsequently, the processing steps of FIG. 5 may be performed to form an array of dielectric diffusion barrier spacers 156. Each dielectric diffusion barrier spacer 156 may encapsulate a respective one of the permeable dielectric spacers 256. The processing steps of FIG. 6 may be subsequently formed. In this configuration, the permeable dielectric spacers 256 function as an additional reservoir for hydrogen atoms, and the dielectric diffusion barrier spacers 156 function as encapsulation structures that prevent escape of hydrogen atoms from each memory cell 150. For each memory cell 150 comprising a pillar structure, a permeable dielectric spacer 256 comprising a hydrogen-permeable dielectric material may contact, and may laterally surround, the pillar structure, and a dielectric diffusion barrier spacer 156 comprising a hydrogen diffusion barrier material may contact, and may laterally surround, the permeable dielectric spacer 256.

Figure 9:
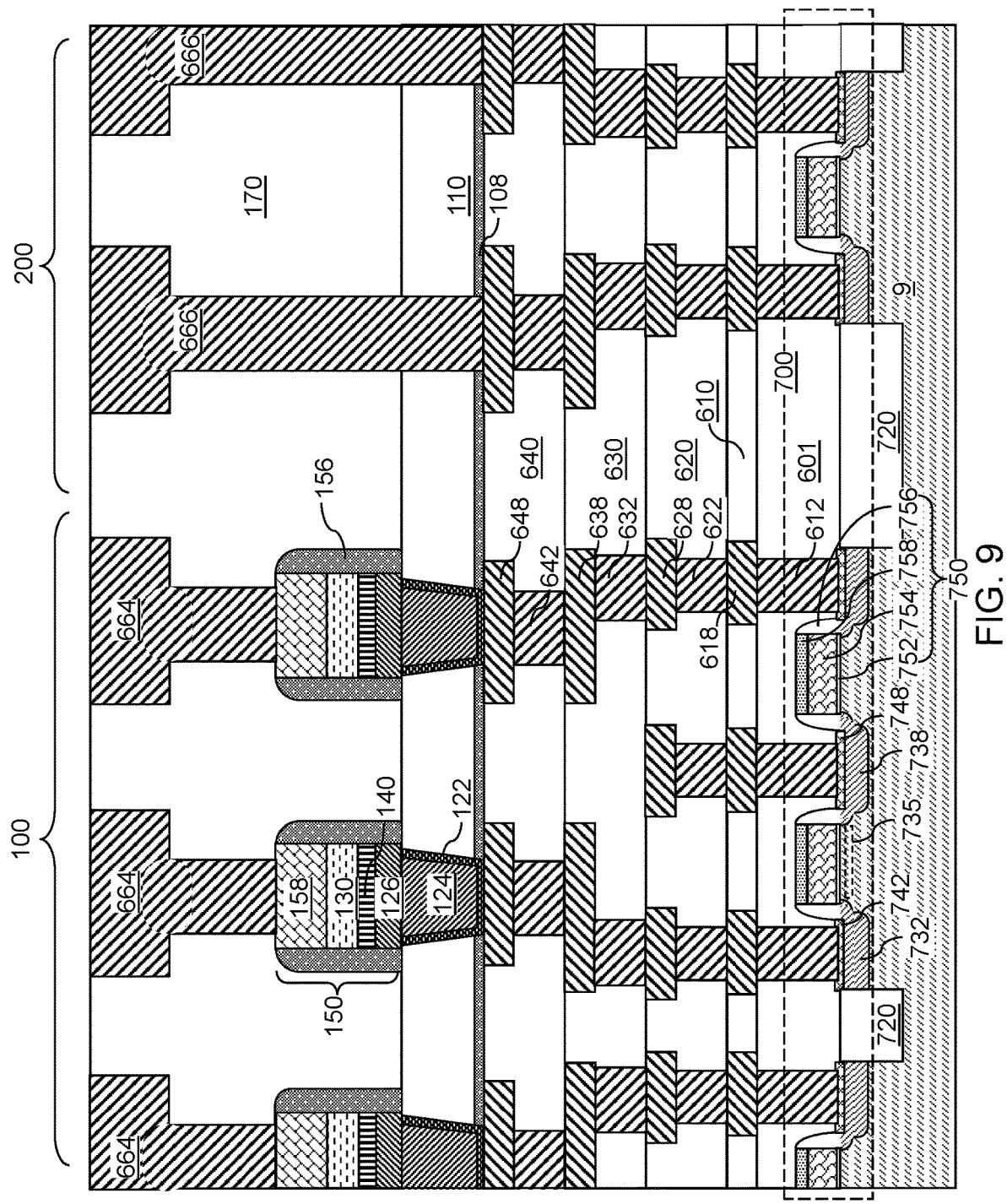
FIG. 9 is a vertical cross-sectional view of a third alternative configuration of the first exemplary structure according to the first embodiment of the present disclosure.

Referring to FIG. 9, a third alternative configuration of the first exemplary structure may be derived from the first exemplary structure illustrated in FIG. 6 by reversing the positions of the semiconducting metal oxide layer 130 and the hydrogen-containing metal layer 140. Generally, a hydrogen-containing metal layer 140 may overlie a semiconducting metal oxide layer 130 with each stack of a hydrogen-containing metal layer 140 and a semiconducting metal oxide layer 130 as illustrated in FIG. 6, or a hydrogen-containing metal layer 140 may underlie a semiconducting metal oxide layer 130 with each stack of a hydrogen-containing metal layer 140 and a semiconducting metal oxide layer 130 as illustrated in FIG. 9. The polarity of programming pulses may be reversed during programming depending on whether a hydrogen-containing metal layer 140 overlies or underlies a semiconducting metal oxide layer 130.

Figure 10:
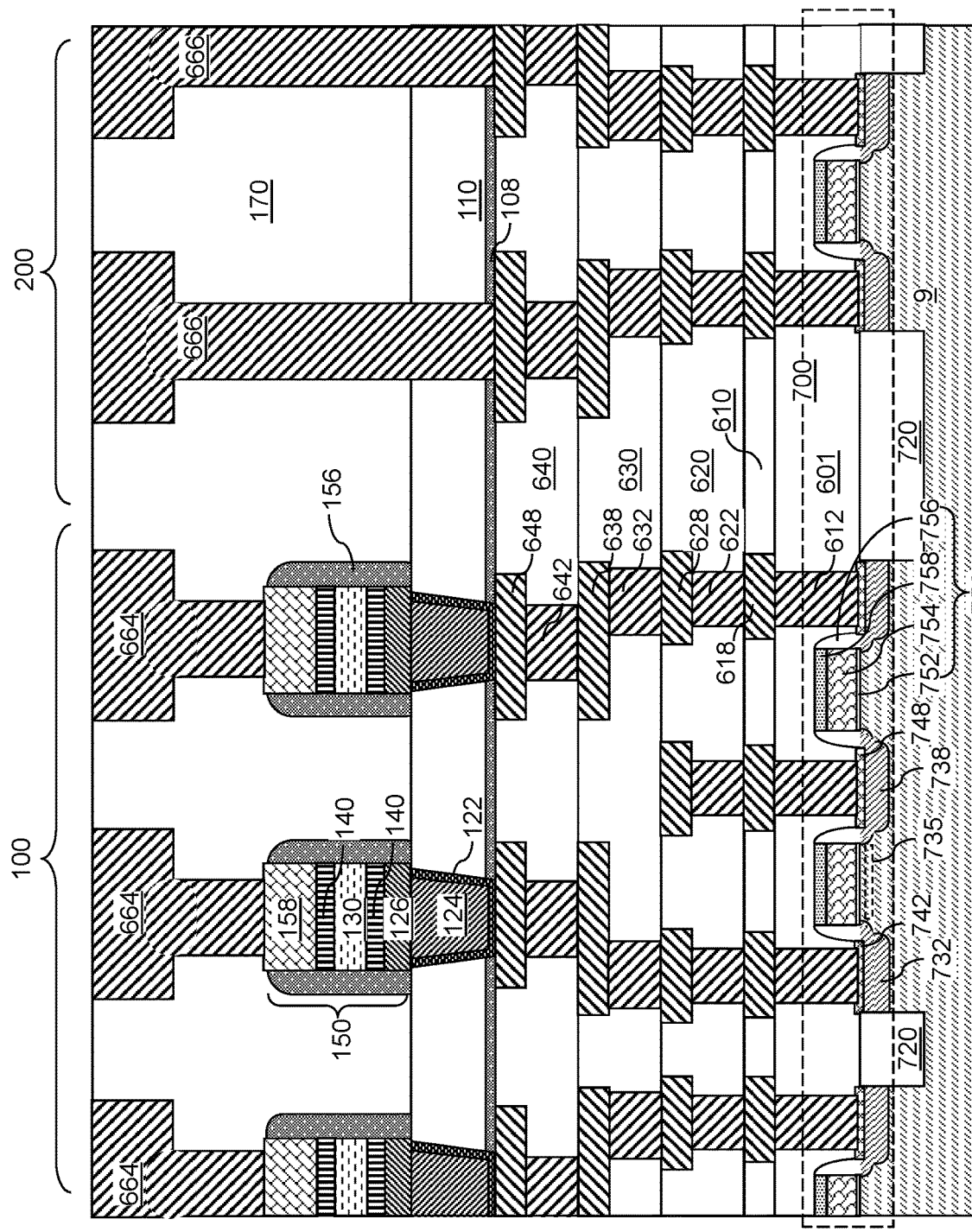
FIG. 10 is a vertical cross-sectional view of a fourth alternative configuration of the first exemplary structure according to the first embodiment of the present disclosure.

Referring to FIG. 10, a fourth alternative configuration of the first exemplary structure may be derived from any configuration of the first exemplary structure illustrated in FIGS. 6-9 by using a plurality of hydrogen-containing metal layers 140. Asymmetry across the first electrode 126 and the second electrode 158 for the purpose of programming each memory cell 150 may be introduced by using different thicknesses for the hydrogen-containing metal layers 140. A memory cell 150 may include a single hydrogen-containing metal layer 140, or may include a plurality of hydrogen-containing metal layers 140. In one embodiment, the at least one hydrogen-containing metal layer 140 within each memory cell 150 may comprises a plurality of hydrogen-containing metal layers 140, and one, or more, and/or each, of the at least one semiconducting metal oxide layer 130 (which may be a single semiconducting metal oxide layer 130 or a plurality of semiconducting metal oxide layers 130) may contact two of the plurality of hydrogen-containing metal layers 140.

Figure 11:
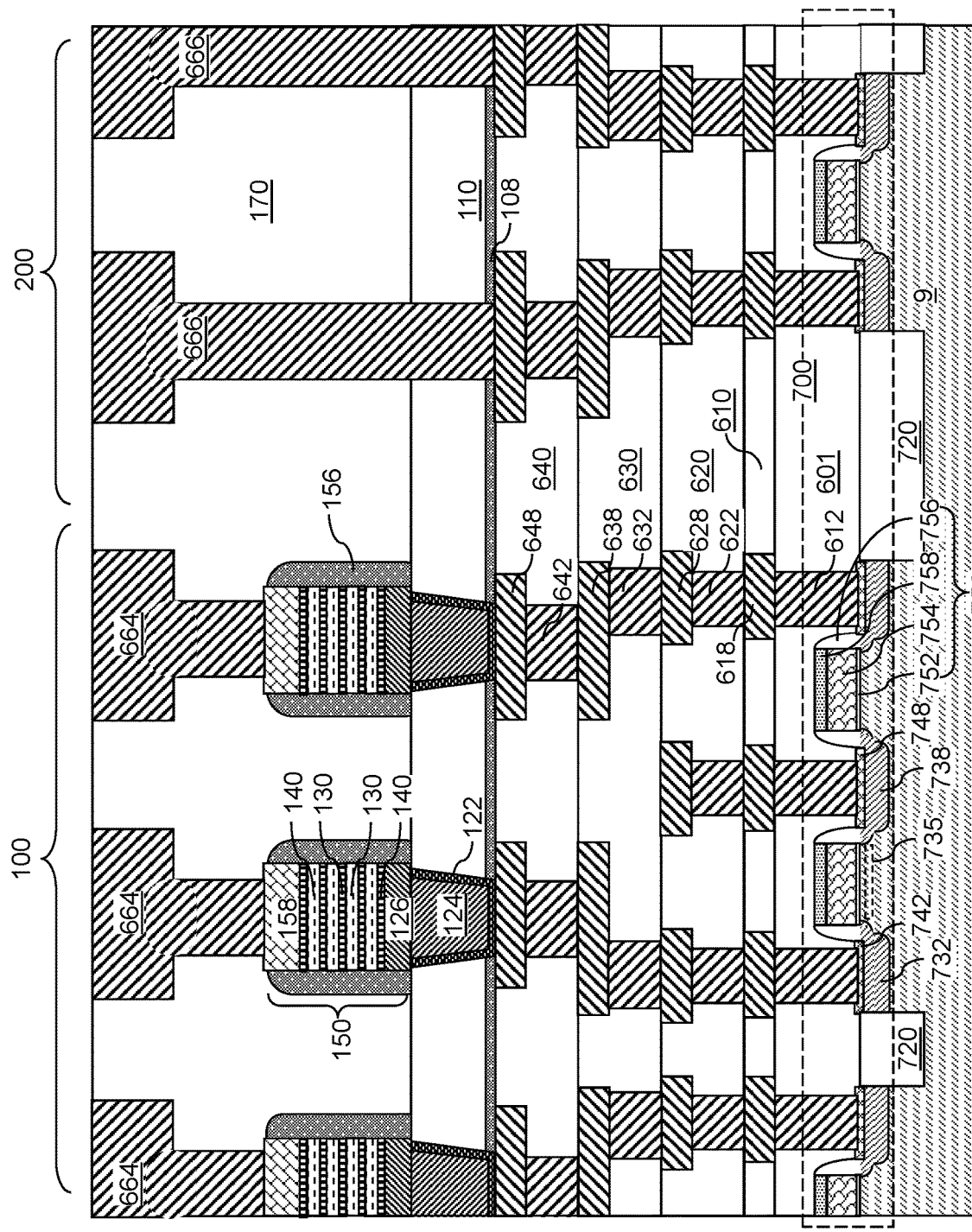
FIG. 11 is a vertical cross-sectional view of a fifth alternative configuration of the first exemplary structure according to the first embodiment of the present disclosure.

Referring to FIG. 11, a fifth alternative configuration of the first exemplary structure may be derived from any configuration of the first exemplary structure illustrated in FIGS. 6-10 by using an interlaced layer stack of at least two hydrogen-containing metal layers 140 and at least two semiconducting metal oxide layers 130. The thickness of each hydrogen-containing metal layers 140 may be in a range from 1 nm to 30 nm such as from 2 nm to 15 nm, although lesser and greater thicknesses may also be used. The thickness of each semiconducting metal oxide layers 130 may be in a range from 1 nm to 30 nm such as from 2 nm to 15 nm, although lesser and greater thicknesses may also be used. Asymmetry across the first electrode 126 and the second electrode 158 for the purpose of programming each memory cell 150 may be introduced by tailoring the thicknesses of each layer within the interlaced layer stack of at least two hydrogen-containing metal layers 140 and at least two semiconducting metal oxide layers 130. For example, the thickness of each hydrogen-containing metal layers 140 may decrease with a distance from the first electrode 126 and the thickness of each semiconducting metal oxide layer 130 may increases with a distance from the first electrode 126, or vice versa.

Referring to FIGS. 12A and 12B, a second exemplary structure is illustrated, which may be used to form a semiconductor device such as a field effect transistor that is capable of storing a memory bit in the form of a resistive state of a channel region. A semiconducting metal oxide layer 30 may be formed over a dielectric material layer 20. The dielectric material layer 20 may be any of the contact-level dielectric material layer 601, the first metal-line-level dielectric material layer 610, the second line-and-via-level dielectric material layer 620, the third line-and-via-level dielectric material layer 630, and the fourth line-and-via-level dielectric material layer 640 illustrated in FIG. 1. Further, the dielectric material layer 20 may be any of the dielectric material layers that may be formed over the first exemplary structure of FIG. 1 or over the first exemplary structure of FIGS. 6-11. In this embodiment, the region in which the second exemplary structure is formed is selected so that metal interconnect structures are not present on the portion of the dielectric material layer 20 over which the second exemplary structure is formed. Alternatively, contact via structures (not shown) and metal lines (not shown) may be formed in an upper portion of the dielectric material layer 20 so that the contact via structures or metal lines contact a source region or a drain region of a field effect transistor upon formation of the source region and the drain region. Alternatively, the dielectric material layer 20 may comprise a portion of a shallow trench isolation structure 720 that extends over a relatively large area such as a device region. Yet alternatively, the dielectric material layer 20 may be provided as an insulating material layer deposited over a substrate such as a semiconductor substrate. Still alternatively, the dielectric material layer 20 may be provided as a portion of an insulating substrate. While only a single field effect transistor is illustrated to describe the semiconductor device of the second embodiment of the present disclosure, embodiments are expressly contemplated in which an array of field effect transistors (such as a two-dimensional array of field effect transistors) is formed over a substrate.

The semiconducting metal oxide layer 30 may have the same material composition as the semiconducting metal oxide material layer 130L of the first exemplary structure, and may be formed by a same deposition process (such as a physical vapor deposition process). The thickness of the semiconducting metal oxide layer 30 may be in a range from 1 nm to 100 nm, such as from 2 nm to 50 nm and/or from 4 nm to 25 nm, although lesser and greater thicknesses may also be used. The semiconducting metal oxide layer 30 may be patterned, for example, by applying a photoresist layer (not shown) over the semiconducting metal oxide layer 30, by lithographically patterning the photoresist layer to include a discrete photoresist material portion, and by etching unmasked portions of the semiconducting metal oxide layer 30. A semiconducting metal oxide layer 30 as patterned by an etch process may have a length along a first horizontal direction hd1 and a width along a second horizontal direction hd2. The length may be in a range from 50 nm to 1 micron, and the width may be in a range from 30 nm to 1 micron, although lesser and greater lengths and widths may also be used. The photoresist layer may be subsequently removed, for example, by ashing. A suitable clean process may be optionally performed.

Referring to FIGS. 13A and 13B, a blanket hydrogen-containing metal layer and a gate electrode material layer may be deposited over the semiconducting metal oxide layer 30. The blanket hydrogen-containing metal layer and the gate electrode material layer may be deposited as blanket material layers, i.e., unpatterned material layers. The blanket hydrogen-containing metal layer of the second exemplary structure may have the same material composition as the hydrogen-containing metal layer 140L of the first exemplary structure, and may be formed by a same deposition process (such as a physical vapor deposition process). The thickness of the blanket hydrogen-containing metal layer of the second exemplary structure may be in a range from 1 nm to 100 nm, such as from 2 nm to 50 nm and/or from 4 nm to 25 nm, although lesser and greater thicknesses may also be used.

The gate electrode material layer includes a metallic gate electrode material. In one embodiment, the gate electrode material layer includes any of the metallic materials that may be used for the first electrode material layer or the second electrode material layer in the first exemplary structure. For example, the gate electrode material layer may include, and/or may consist essentially of, a conductive metallic nitride material and/or an elemental metal and/or an intermetallic alloy. For example, conductive metallic nitride materials that may be used for the gate electrode material layer include TiN, TaN, or WN. Elemental metals that may be used for the gate electrode material layer include, but are not limited to, W, Ta, Re, Nb, Mb, Ru, Co, and Ni. Generally, an elemental metal that is resistant to hydrogen diffusion may be used for the gate electrode material layer. In one embodiment, a refractory metal having a melting point higher than 2,000 degrees Celsius may be used for the gate electrode material layer. The gate electrode material layer may be deposited by physical vapor deposition or chemical vapor deposition. The thickness of the gate electrode material layer may be in a range from 50 nm to 200 nm, although lesser and greater thicknesses may also be used. A stack of multiple metal layers may be used as the gate electrode material layer.

A photoresist layer (not shown) may be applied over the gate electrode material layer, and may be lithographically patterned with a gate pattern. For example, a rectangular area that extends across a middle portion of the semiconducting metal oxide layer 30 may be used as a masked area of the gate pattern. An anisotropic etch process may be performed to etch the unmasked portions of the gate electrode material layer and the blanket hydrogen-containing metal layer. In one embodiment, the anisotropic etch process may include a first anisotropic etch step that etches unmasked portions of the gate electrode material layer selective to the material of the blanket hydrogen-containing metal layer, and a second anisotropic etch step that etches unmasked portions of the blanket hydrogen-containing metal layer selective to the material of the semiconducting metal oxide layer 30. The photoresist layer may be subsequently removed, for example, by ashing.

A remaining portion of the gate electrode material layer overlying the semiconducting metal oxide layer 30 comprises a gate electrode 50. A remaining portion of the blanket hydrogen-containing metal layer underlying the gate electrode 50 comprises a hydrogen-containing metal layer 40, which is incorporated into the semiconductor device of the second exemplary structure. A gate stack of a hydrogen-containing metal layer 40 and a gate electrode 50 may straddle over a center portion of the semiconducting metal oxide layer 30 along the second horizontal direction hd2. The dimension of the gate stack (40, 50) along the first horizontal direction hd1 is herein referred to as a gate length, which may be in a range from 10 nm to 300 nm, such as from 30 nm to 100 nm, although lesser and greater gate lengths may also be used.

The hydrogen-containing metal layer 40 is located on a surface of the semiconducting metal oxide layer 30, and comprises, and/or consists essentially of, at least one metal selected from platinum, iridium, osmium, and ruthenium at an atomic percentage that is at least 90% and hydrogen atoms at an atomic percentage in a range from 0.001% to 10%, such as from 0.01% to 5% and/or from 0.1% to 3%. The gate electrode 50 is located on the hydrogen-containing metal layer 40. Sidewalls of the gate electrode 50 and sidewalls of the hydrogen-containing metal layer 40 may be vertically coincident, i.e., may be located in common vertical planes.

Referring to FIGS. 14A and 14B, suitable electrical dopants may be implanted into unmasked portions of the semiconducting metal oxide layer 30 by performing an ion implantation process. The gate electrode 50 may be used as an ion implantation mask during the ion implantation process. Electrical dopants that may form excess holes or excess electrons in the implanted portions of the semiconducting metal oxide layer 30 include, but are not limited to, Na, K, Mg, Ca, Sr, Y, La, B, Al, Ga, N, P, As, Sb, F, Cl, and other elements that may induce formation of excess holes or excess electrons in the semiconducting metal oxide layer 30. Alternatively or additionally, a plasma treatment may be optionally performed to improve electrical characteristics of the semiconducting metal oxide material in the semiconducting metal oxide layer 30. A source region 32 is formed in one side of the semiconducting metal oxide layer 30, and a drain region 38 is formed in another side of the semiconducting metal oxide layer 30. The unimplanted portion of the semiconducting metal oxide layer 30 constitutes a channel region 35, which underlies the gate electrode 50.

A dielectric diffusion barrier material layer may be conformally deposited over the gate electrode 50 and the semiconducting metal oxide layer 30 by a conformal deposition process such as a chemical vapor deposition process. The dielectric diffusion barrier material layer includes a hydrogen diffusion barrier material layer that blocks diffusion of hydrogen. For example, the dielectric diffusion barrier material may include silicon nitride. The thickness of the dielectric diffusion barrier material layer may be in a range from 5 nm to 50 nm, such as from 10 nm to 25 nm, although lesser and greater thicknesses may also be used.

An anisotropic etch process may be performed to remove horizontal portions of the dielectric diffusion barrier material layer. A remaining vertically-extending portion of the dielectric diffusion barrier material layer comprise a dielectric diffusion barrier spacers 56 that contact, laterally surround, the gate stack including the hydrogen-containing metal layer 40 and the gate electrode 50. The hydrogen-containing metal layer 40 functions as a hydrogen reservoir for the channel region 35. Hydrogen atoms may be injected into from the hydrogen-containing metal layer 40 into the channel region 35 to program the channel region 35 into a hydrogenated state. Additionally, the hydrogen atoms may be extracted from the channel region 35 into the hydrogen-containing metal layer 40 to program the channel region 35 into a de-hydrogenated state. The gate electrode 50 may include a metallic material that prevents diffusion of hydrogen atoms therethrough. The dielectric diffusion barrier spacers 56 function as an enclosure that prevents escape of hydrogen atoms from the field effect transistor.

Generally, programming of the channel region 35 of the field effect transistor into the hydrogenated state may be effected by applying a first programming pulse having a first polarity to the gate electrode 50 with respective to the source region 32 and/or with respective to the drain region 38. Programming of the channel region 35 of the field effect transistor into the de-hydrogenated state may be effected by applying a second programming pulse having a second polarity which is the opposite of the first polarity to the gate electrode 50 with respective to the source region 32 and/or with respective to the drain region 38. In one embodiment, the source region 32 and the drain region 38 may be biased with a same voltage during programming of the channel region 35 into the hydrogenated state or into the dehydrogenated state.

In one embodiment, the hydrogenated state of the channel region 35 includes hydrogen atoms at a high atomic concentration, which may be in a range from 0.001% to 10%, such as from 0.01% to 5% and/or from 0.1% to 3%. The de-hydrogenated state of the channel region 35 includes hydrogen atoms at a low atomic concentration, which may be in a range from 0.0001% to 3.3%, such as from 0.001% to 1.67% and/or from 0.01% to 1%. Generally, the ratio of the atomic percentage of hydrogen atoms in the hydrogenated state of the channel region 35 of a semiconducting metal oxide layer 30 to the atomic percentage of hydrogen atoms in the de-hydrogenated state of the channel region 35 of the semiconducting metal oxide layer 30 may be in a range from 3-100, such as from 5 to 10, although lesser and greater ratios may also be used.

Referring to FIGS. 15A and 15B, a dielectric material layer may be deposited over the gate electrode 50 and the semiconducting metal oxide layer 30. The dielectric material layer is herein referred to as a contact-via-level dielectric layer 70. The contact-via-level dielectric layer 70 may include a planarizable dielectric material such as undoped silicate glass or a doped silicate glass, or a self-planarizing dielectric material such as flowable oxide (FOX). Optionally, a chemical mechanical planarization process may be performed to planarize the top surface of the contact-via-level dielectric layer 70.

Contact via cavities may be formed though the contact-via-level dielectric layer 70. A top surface of the source region 32, a top surface of the drain region 38, and a top surface of the gate electrode 50 may be physically exposed at the bottom of the contact via cavities. At least one conductive material such as a combination of a conductive metallic liner material (e.g., TiN, TaN, and/or WN) and a conductive metallic fill material (e.g., W, Cu, Co, Mo, Ru, another elemental metal, or an intermetallic alloy) may be deposited in the contact via cavities. Physical vapor deposition, chemical vapor deposition, electroplating, and/or electroless plating may be used to deposit the at least one conductive material. Excess portions of the at least one conductive material may be removed from above the horizontal plane including the top surface of the contact-via-level dielectric layer 70 by a planarization process such as a recess etch and/or a chemical mechanical planarization process. Remaining portions of the at least one conductive material filling the contact via cavities comprise a source contact via structure 72, a drain contact via structure 78, and a gate contact via structure 75. The source contact via structure 72 may contact the source region 32, the drain contact via structure 78 may contact the drain region 38, and the gate contact via structure 75 may contact the gate electrode 50.

Referring to FIGS. 16A and 16B, a first alternative configuration of the second exemplary structure is illustrated, which may be derived from the second exemplary structure of FIGS. 15A and 15B by omitting formation of the dielectric diffusion barrier spacers 56. In this embodiment, the contact-via-level dielectric layer 70 may include a hydrogen diffusion barrier material such as silicon oxide. Alternatively, the contact-via-level dielectric layer 70 may include a layer stack containing a hydrogen diffusion barrier material liner (such as a silicon nitride liner) and an interlayer dielectric material layer (such as a layer of undoped silicate glass, a doped silicate glass, organosilicate glass, or a porous dielectric material).

Referring to FIGS. 17A and 17B, a second alternative configuration of the second exemplary structure may be derived from the second exemplary structure by forming a combination of a permeable dielectric spacer 456 and a dielectric diffusion barrier spacer 56 in lieu of a dielectric diffusion barrier spacer 56 in the second exemplary structure of FIGS. 15A and 15B. In this embodiment, a permeable dielectric material layer through which hydrogen atoms may permeate may be conformally formed directly on sidewalls of the gate stack (40, 50) after formation of the source region 32 and the drain region 38. The permeable dielectric material layer may include a dielectric material such as silicon oxide, organosilicate glass, or a porous dielectric material. An anisotropic etch may be performed to remove horizontal portions of the permeable dielectric material layer, and each remaining vertically-extending portion of the permeable dielectric material layer constitutes a permeable dielectric spacer 456. Each permeable dielectric spacer 456 may have a lateral thickness in a range from 1 nm to 50 nm, such as from 3 nm to 20 nm, between an inner sidewall and an outer sidewall, although lesser and greater thicknesses may also be used. The top surfaces of the permeable dielectric spacers 456 may be located below the horizontal plane including the top surfaces of the gate electrode 50 to facilitate coverage of the a top portion of the permeable dielectric spacer 456 by a dielectric diffusion barrier spacer 56 that is subsequently formed.

Subsequently, a dielectric diffusion barrier spacer 56 may be formed on the permeable dielectric spacer 456. Each dielectric diffusion barrier spacer 56 may encapsulate a respective one of the permeable dielectric spacers 456. The processing steps of FIGS. 15A and 15B may be subsequently performed. In this configuration, the permeable dielectric spacers 456 function as an additional reservoir for hydrogen atoms, and the dielectric diffusion barrier spacers 56 function as encapsulation structures that prevent escape of hydrogen atoms from each field effect transistor. The permeable dielectric spacer 456 comprising a hydrogen-permeable dielectric material may contact, and may laterally surround, the gate stack (40, 50), and a dielectric diffusion barrier spacer 56 comprising a hydrogen diffusion barrier material may contact, and may laterally surround, the permeable dielectric spacer 456.

Referring to FIGS. 18A and 18B, a third alternative configuration of the second exemplary structure may be derived from any configuration of the second exemplary structure illustrated in FIGS. 15A-17B by forming a recess trench in the dielectric material layer 20 prior to formation of the semiconducting metal oxide layer 30, and by filling the recess trench with metal line that forms a backside gate electrode 350 for the field effect transistor. In embodiments in which the dielectric material layer 20 is a interconnect-level dielectric material layer located in a back-end-of-line structure such as the contact-level dielectric material layer 601, the first metal-line-level dielectric material layer 610, the second line-and-via-level dielectric material layer 620, the third line-and-via-level dielectric material layer 630, or the fourth line-and-via-level dielectric material layer 640 illustrated in FIG. 1, the backside gate electrode 350 may be formed concurrently with metal line structures that are embedded in the interconnect-level dielectric material layer, such as the first metal line structures 618, the second metal line structures 628, the third metal line structures 638, or the fourth metal line structures 648. Further, embodiments are expressly contemplated in which the backside gate electrode 350 comprises a metal line structure in an upper metal interconnect structure overlying the fourth line-and-via-level dielectric material layer 640. Alternatively, the dielectric material layer 20 may comprise a shallow trench isolation structure.

The thickness of the backside gate electrode 350 may be in a range from 20 nm to 200 nm, although lesser and greater thicknesses may also be used. The backside gate electrode 350 may include a metal that is resistant to hydrogen diffusion. For example, the backside gate electrode 350 may include a conductive metallic nitride material and/or an elemental metal and/or an intermetallic alloy. For example, conductive metallic nitride materials that may be used for the backside gate electrode 350 include TiN, TaN, or WN. Elemental metals that may be used for the backside gate electrode 350 include, but are not limited to, W, Ta, Re, Nb, Mb, Ru, Co, and Ni. Generally, an elemental metal that is resistant to hydrogen diffusion may be used for the backside gate electrode 350. In one embodiment, a refractory metal having a melting point higher than 2,000 degrees Celsius may be used for the backside gate electrode 350. The semiconducting metal oxide layer 30 may be formed over a planarized top surface of the backside gate electrode 350. The area of the backside gate electrode 350 may overlap with the area of the gate electrode 50. The combination of the gate electrode 50 and the backside gate electrode 350 provides a dual gate configuration that provides a tighter control of the threshold voltage. The backside gate electrode 350 may provide a variable channel bias voltage to compensate for the drift in the transistor characteristics of the field effect transistor including the source region 32, the drain region 38, the channel region 35, the hydrogen-containing metal layer 40, and the gate electrode 50 that may be caused by gradual loss of hydrogen atoms over a long period of usage.

Figure 19A:
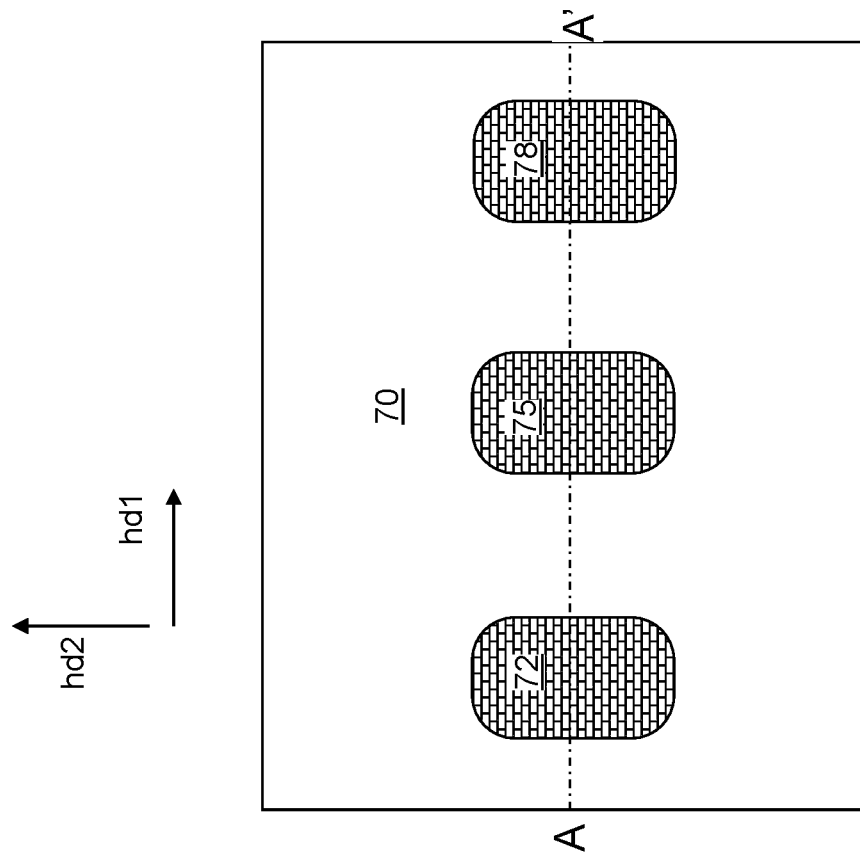
FIG. 19A is a vertical cross-sectional view of a fourth alternative configuration of the second exemplary structure according to the second embodiment of the present disclosure.
Figure 19B:
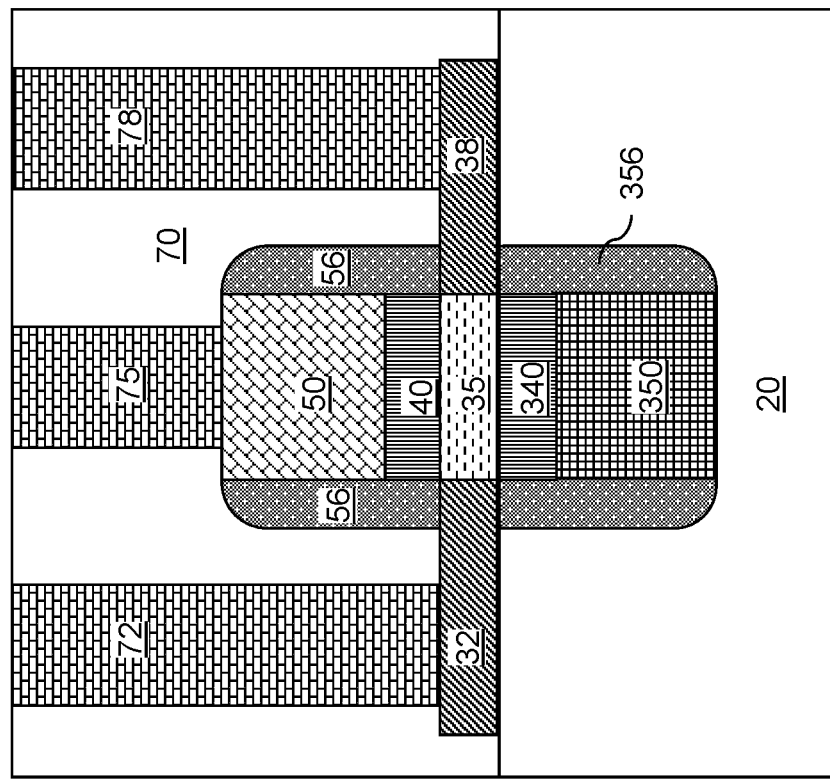
FIG. 19B is a top-down view of the fourth alternative configuration of the second exemplary structure of FIG.

Referring to FIGS. 19A and 19B, a fourth alternative configuration of the second exemplary structure may be derived from any configuration of the second exemplary structure illustrated in FIGS. 15A-17B by forming a recess trench in the dielectric material layer 20, by forming a backside dielectric diffusion barrier spacer 356 including a hydrogen blocking barrier dielectric material (such as silicon nitride) around the sidewalls of the recess trench, and by forming a stack of a backside gate electrode 350 and a backside hydrogen-containing metal layer 340 within the recess trench.

The backside dielectric diffusion barrier spacer 356 may be formed by conformally depositing a backside dielectric diffusion barrier layer and anisotropically etching the backside dielectric diffusion barrier layer. The backside gate electrode 350 may be formed by depositing at least one conductive material in the cavity that is laterally surrounded by the backside dielectric diffusion barrier spacer 356, and by vertically recessing the at least one conductive material below the horizontal plane including the top surface of the dielectric material layer 20 by using a planarization process that includes a recess etch process. For example, a chemical mechanical planarization process may be used to remove the portion of the at least one conductive material from above the horizontal plane including the top surface of the dielectric material layer 20, and a recess etch process may be performed to vertically recess the top surface of a remaining portion of the at least one conductive material. A remaining portion of the at least one conductive material in the recess trench constitutes the backside gate electrode 350. The recess depth may be the same as the thickness of the backside hydrogen-containing metal layer 340 to be subsequently formed. For example, the recess depth may be in a range from 1 nm to 100 nm, such as from 2 nm to 50 nm and/or from 4 nm to 25 nm, although lesser and greater recess depths may also be used. The backside gate electrode 350 may include the same material as in the third alternative configuration of the second exemplary structure illustrated in FIGS. 18A and 18B.

The backside hydrogen-containing metal layer 340 may be formed by using the same processing steps that are used to form a hydrogen-containing metal layer 140L in the first exemplary structure. The backside hydrogen-containing metal layer 340 may have the same material composition and the same thickness range as any of the hydrogen-containing metal layers 140L that may be used in the first exemplary structure. Subsequently, the processing steps of FIGS. 12A-17B may be performed to provide the fourth configuration of the second exemplary structure illustrated in FIGS. 19A and 19B.

Referring to FIGS. 12A-19B and related drawings and according to various embodiments of the present disclosure, a semiconductor device is provided, which comprises: a semiconducting metal oxide layer 30 located on a dielectric material layer 20 and comprising a source region 32, a drain region 38, and a channel region 35 located between the source region 32 and the drain region 38; a hydrogen-containing metal layer 40 located on a surface of the channel region 35 and comprising at least one metal selected from platinum, iridium, osmium, and ruthenium at an atomic percentage that is at least 90% and comprising hydrogen atoms; and a gate electrode 50 located on the hydrogen-containing metal layer 40.

In one embodiment, the semiconductor device comprises a dielectric diffusion barrier spacer 56 comprising a hydrogen diffusion barrier material and contacting, and laterally surrounding, the hydrogen-containing metal layer 40 and the gate electrode 50.

In one embodiment, the semiconductor device comprises a permeable dielectric spacer 456 comprising a hydrogen-permeable dielectric material and contacting, and laterally surrounding, the gate electrode 50 and the hydrogen-containing metal layer 40; and a dielectric diffusion barrier spacer 56 comprising a hydrogen diffusion barrier material and contacting, and laterally surrounding, the permeable dielectric spacer 456.

In one embodiment, the semiconductor device comprises: a backside gate electrode 350 embedded within the dielectric material layer 20; and a backside hydrogen-containing metal layer 340 comprising at least one additional metal selected from platinum, iridium, osmium, and ruthenium at an atomic percentage that is at least 90% and comprising hydrogen atoms at an atomic percentage in a range from 0.001% to 10% and located between a bottom surface of the channel region 35 and the backside gate electrode 350. The at least one additional metal may be the same as, or may be different from, the at least one metal of the hydrogen-containing metal layer 40.

In one embodiment, the semiconductor device comprises a backside gate electrode 350 embedded within the dielectric material layer 20 and in contact with a backside surface of the channel region 35.

Referring to FIG. 20, a flowchart illustrates general processing steps of the methods of manufacturing a memory device of the first embodiment of the present disclosure. Referring to step 2010 and FIGS. 1 and 2, a dielectric material layer (such as a connection-via-level dielectric layer 110, a fourth line-and-via-level dielectric material layer 640, any other interconnect-level dielectric layer, or a laterally extending portion of a shallow trench isolation structure 720) is formed over a substrate 9. Referring to step 2020 and FIG. 3, a material layer stack including a first electrode material layer 126L, at least one semiconducting metal oxide material layer 130L, at least one hydrogen-containing metal layer 140L, and a second electrode material layer 158L may be formed over the dielectric material layer 20. Referring to step 2030 and FIG. 4, the material layer stack (126L, 130L, 140L, 158L) may be patterned into at least one pillar structure including a first electrode 126, a memory layer stack (130, 140), and a second electrode 158. Subsequently, the processing steps of FIGS. 5-11 may be performed.

Referring to FIG. 21, a flowchart illustrates general processing steps of the methods of manufacturing a semiconductor device (which may be a memory device) of the second embodiment of the present disclosure. Referring to step 2110 and FIGS. 12A and 12B, 18A and 18B, and 19A and 19B, a semiconducting metal oxide layer 30 is formed over a dielectric material layer 20. Referring to step 2120 and FIGS. 13A and 13B, 18A and 18B, and 19A and 19B, a hydrogen-containing metal layer 40 and a gate electrode 50 may be formed over the semiconducting metal oxide layer 30. Referring to step 2130 and FIGS. 14A and 14B, 18A and 18B, and 19A and 19B, a source region 32 and a drain region 38 may be formed in the semiconducting metal oxide layer 30. Subsequently, additional processing steps of FIGS. 14A-19B may be performed.

Referring to FIG. 22, a flowchart illustrates general steps for operating a semiconductor device of the present disclosure, which may be any of the first exemplary structures and the second exemplary structures. Referring to step 2210 and FIGS. 6-11 and 15A 19B, a semiconductor device including a layer stack {(130, 140) or (30, 40)} between a first electrode (126 or 32) and a second electrode (158 or 38), wherein the layer stack includes at least one semiconducting metal oxide layer (130 or 30) and at least one hydrogen-containing metal layer (140 or 40) is provided over a dielectric material layer {(110 or 640) or 20}. In the second exemplary structure, the source region 32 functions as the first electrode, and the drain region 38 functions as the second electrode. Each of the at least one hydrogen-containing metal layer (140 or 40) comprises at least one metal selected from platinum, iridium, osmium, and ruthenium at an atomic percentage that is at least 90% and comprises hydrogen atoms at an atomic percentage in a range from 0.001% to 10%.

Referring to step 2220, the semiconductor device may be programmed into a hydrogenated state or a de-hydrogenated state by applying a programming pulse across the first electrode 126 and the second electrode 158 or across a gate electrode 50 located on the at least one hydrogen-containing metal layer 40 and one of the first electrode (comprising a source region 32) and the second electrode (comprising a drain region 38). The hydrogenated state is a state in which the at least one semiconducting metal oxide layer (130, 30) is impregnated with hydrogen atoms and the de-hydrogenated state is a state in which the at least one semiconducting metal oxide layer (130, 30) is hydrogen-depleted. Referring to step 2230, a memory state of the semiconductor device may be determined by measuring electrical conductance of a measurement current path between the first electrode (126 or 32) and the second electrode (158 or 38) under a measurement bias condition.

In the first embodiment, the measurement current path extends through each layer within the layer stack (130, 140) along a direction that is perpendicular to each interface between each neighboring pair of layers within the layer stack. A sense amplifier may be used to measure the magnitude of the measurement current and to determine the memory state of a memory cell 150. In one embodiment, programming the semiconductor device into the hydrogenated state comprises applying a first programming pulse having a first polarity to the second electrode 158 relative to the first electrode 126, and programming the semiconductor device into the de-hydrogenated state comprises applying a second programming pulse having a second polarity that is an opposite of the first polarity to the second electrode 158 relative to the first electrode 126.

In the second embodiment, the at least one semiconducting metal oxide layer comprises a semiconducting metal oxide layer 30 containing a source region 32 (as the first electrode), a drain region 38 (as the second electrode), and a channel region 35 located between the source region 32 and the drain region 38. The first electrode comprises the source region 32 and the second electrode comprises the drain region 38. The electrically conductive path extends through the channel region 35 along a direction that is parallel to an interface between the channel region 35 and the at least one hydrogen-containing metal layer 40 that is in contact with the channel region 35. A sense amplifier may be used to measure the magnitude of the measurement current and to determine the memory state of the semiconductor device, which comprises a field effect transistor with a variable threshold voltage that is modulated by hydrogen levels in the channel region 35.

In one embodiment, programming the semiconductor device into the hydrogenated state comprises applying a first programming pulse having a first polarity to the gate electrode 50 relative to the one (or both) of the first electrode (comprising the source region 32) and the second electrode (comprising the drain region 38); and programming the semiconductor device into the de-hydrogenated state comprises applying a second programming pulse having a second polarity that is an opposite of the first polarity to the gate electrode 50 relative to the one (or both) of the first electrode and the second electrode.

The various embodiments of the present disclosure provide semiconducting metal oxide memory devices using hydrogen-mediated threshold voltage modulation. Specifically, the amount of hydrogen in the at least one semiconducting metal oxide layer (130, 30) determines the conductivity of the at least one semiconducting metal oxide layer (130, 30), and provides a hydrogen-mediated threshold voltage for the semiconducting metal oxide memory devices. Electrical current passing through the at least one semiconducting metal oxide layer (130, 30) may be above, or below, a predefined threshold level depending on whether the at least one semiconducting metal oxide layer (130, 30) is in a hydrogenated state or in a de-hydrogenated state. As such the at least one semiconducting metal oxide layer (130, 30) may encode a bit in a non-volatile and reversible manner. A non-volatile memory device with long endurance may be provided by the devices of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
a first electrode;
a memory layer stack located on the first electrode and including at least one semiconducting metal oxide layer and at least one hydrogen-containing metal layer comprising at least one metal selected from platinum, iridium, osmium, and ruthenium at an atomic percentage that is at least 90% and comprising hydrogen atoms; and a second electrode located over the memory layer stack.

2. The memory device of claim 1, further comprising:
a first metal interconnect structure embedded within a first dielectric material layer and contacting a bottom surface of the first electrode; and
a second metal interconnect structure embedded within a second dielectric material layer and contacting a top surface of the second electrode.

3. The memory device of claim 2, further comprising:
a semiconductor substrate underlying the first dielectric material layer; and
field effect transistors located on the semiconductor substrate, wherein the first electrode or the second electrode is electrically connected to one of the field effect transistors through additional metal interconnect structures located between the semiconductor substrate and first dielectric material layer.

4. The memory device of claim 1, wherein each of the at least one semiconducting metal oxide layer contacts a horizontal surface of a respective one of the at least one hydrogen-containing metal layer.

5. The memory device of claim 1, wherein:
the memory layer stack comprises a single semiconducting metal oxide layer and a single hydrogen-containing metal layer that are in contact with each other;
the single semiconducting metal oxide layer contacts one of the first electrode and the second electrode; and
the single hydrogen-containing metal layer contacts another of the first electrode and the second electrode, wherein the single hydrogen-containing metal layer comprises the hydrogen atoms at an atomic percentage below 10%.

6. The memory device of claim 1, wherein:
the at least one hydrogen-containing metal layer comprises a plurality of hydrogen-containing metal layers; and
one of the at least one semiconducting metal oxide layer contacts two of the plurality of hydrogen-containing metal layers.

7. The memory device of claim 1, wherein the memory layer stack comprises an interlaced layer stack of at least two hydrogen-containing metal layers and at least two semiconducting metal oxide layers.

8. The memory device of claim 1, wherein a combination of the first electrode, the memory layer stack, and the second electrode comprises a pillar structure having a top surface that is a top surface of the second electrode, having a bottom surface that is a bottom surface of the first electrode, and having a sidewall that extends straight between a periphery of the top surface of the second electrode and a periphery of the bottom surface of the first electrode.

9. The memory device of claim 8, further comprising a dielectric diffusion barrier spacer comprising a hydrogen diffusion barrier material and contacting, and laterally surrounding, the pillar structure.

10. The memory device of claim 8, further comprising:
a permeable dielectric spacer comprising a hydrogen-permeable dielectric material and contacting, and laterally surrounding, the pillar structure; and
a dielectric diffusion barrier spacer comprising a hydrogen diffusion barrier material and contacting, and laterally surrounding, the permeable dielectric spacer.

11. A semiconductor device comprising:

a semiconducting metal oxide layer located on a dielectric material layer and comprising a source region, a drain region, and a channel region located between the source region and the drain region;
a hydrogen-containing metal layer located on a surface of the channel region and comprising at least one metal selected from platinum, iridium, osmium, and ruthenium at an atomic percentage that is at least 90% and comprising hydrogen atoms; and
a gate electrode located on the hydrogen-containing metal layer.

12. The semiconductor device of claim 11, further comprising a dielectric diffusion barrier spacer comprising a hydrogen diffusion barrier material and contacting, and laterally surrounding, the hydrogen-containing metal layer and the gate electrode.

13. The semiconductor device of claim 11, further comprising:
a permeable dielectric spacer comprising a hydrogen-permeable dielectric material and contacting, and laterally surrounding, the gate electrode and the hydrogen-containing metal layer; and
a dielectric diffusion barrier spacer comprising a hydrogen diffusion barrier material and contacting, and laterally surrounding, the permeable dielectric spacer.

14. The semiconductor device of claim 11, further comprising:
a backside gate electrode embedded within the dielectric material layer; and
a backside hydrogen-containing metal layer comprising at least one additional metal selected from platinum, iridium, osmium, and ruthenium at an atomic percentage that is at least 90% and comprising hydrogen atoms at an atomic percentage in a range below 10% and located between a bottom surface of the channel region and the backside gate electrode,
wherein the at least one additional metal is the same as, or is different from, the at least one metal of the hydrogen-containing metal layer.

15. The semiconductor device of claim 11, further comprising a backside gate electrode embedded within the dielectric material layer and in contact with a backside surface of the channel region.

16. A semiconductor device, comprising:
a memory layer stack including at least one semiconducting metal oxide layer and at least one hydrogen-containing metal layer comprising at least one metal selected from platinum, iridium, osmium, and ruthenium at an atomic percentage that is at least 90% and comprising hydrogen atoms; and
a programming device configured to program the at least one hydrogen-containing metal layer into a hydrogenated state or a de-hydrogenated state by applying a programming pulse across the memory layer stack, wherein the hydrogenated state is a state in which the at least one semiconducting metal oxide layer is impregnated with hydrogen atoms and wherein the de-hydrogenated state is a state in which the at least one semiconducting metal oxide layer is hydrogen-depleted.

17. The semiconductor device of claim 16, further comprising:
a first electrode located on a first side of the memory layer stack; and
a second electrode located on a second side of the memory layer stack.

18. The semiconductor device of claim 17, wherein the programming device is configured to apply the programming pulse across the first electrode and the second electrode.

19. The semiconductor device of claim 16, wherein:
the at least one semiconducting metal oxide layer comprises a source region, a drain region, and a channel region located between the source region and the drain region;
the hydrogen-containing metal layer is located on a surface of the channel region; and
a gate electrode is located on the hydrogen-containing metal layer.

20. The semiconductor device of claim 19, wherein the programming device is configured to apply the programming pulse across the gate electrode and one of the source region and the drain region.

* * * * *